US008546214B2

(12) United States Patent
Orimoto et al.

(10) Patent No.: US 8,546,214 B2
(45) Date of Patent: Oct. 1, 2013

(54) P-TYPE CONTROL GATE IN NON-VOLATILE STORAGE AND METHODS FOR FORMING SAME

(75) Inventors: Takashi Whitney Orimoto, Sunnyvale, CA (US); Atsushi Suyama, Naoya (JP); Ming Tian, Yokkaichi (JP); Henry Chin, Santa Clara, CA (US); Henry Chien, San Jose, CA (US); Vinod Robert Purayath, Santa Clara, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 362 days.

(21) Appl. No.: 12/887,328

(22) Filed: Sep. 21, 2010

(65) Prior Publication Data

US 2011/0260235 A1 Oct. 27, 2011

Related U.S. Application Data

(60) Provisional application No. 61/327,027, filed on Apr. 22, 2010.

(51) Int. Cl.
*H01L 21/8242* (2006.01)

(52) U.S. Cl.
USPC .......................................................... 438/239

(58) Field of Classification Search
USPC .......................................................... 438/239
See application file for complete search history.

(56) References Cited

U.S. PATENT DOCUMENTS 3,617,824 A 11/1971 Shinoda et al.
6,326,663 B1 12/2001 Li et al.
2003/0071288 A1* 4/2003 Nachumovsky .............. 257/225
2006/0057794 A1 3/2006 Youn et al.
2008/0023778 A1 1/2008 Henson et al.
2008/0157173 A1 7/2008 Hong

FOREIGN PATENT DOCUMENTS

EP 2063459 A1 5/2009
JP 3177065 A 8/1991
JP 07193198 A * 7/1995
JP 10289957 A 10/1998
WO 0117021 A1 3/2001

OTHER PUBLICATIONS

International Search Report and Written Opinion of the International Searching Authority dated Jun. 22, 2011, PCT Application No. PCT/US2011/032635, filed Apr. 15, 2011, 10 pages.
English Abstract of foreign patent document JP3177065, Published Aug. 1, 1991, Applicant Kawasaki Steel Company, 1 page.
English Abstract of foreign patent document JP10289957, Published Oct. 27, 1998, Applicant Seiko Epson Corporation, 1 page.

* cited by examiner

*Primary Examiner* — Ajay K Arora
(74) *Attorney, Agent, or Firm* — Vierra Magen Marcus LLP

(57) ABSTRACT

Non-voltage storage and techniques for fabricating non-volatile storage are disclosed. In some embodiments, at least a portion of the control gates of non-volatile storage elements are formed from p-type polysilicon. In one embodiment, a lower portion of the control gate is p-type polysilicon. The upper portion of the control gate could be p-type polysilicon, n-type polysilicon, metal, metal nitride, etc. P-type polysilicon in the control gate may not deplete even at high Vpgm. Therefore, a number of problems that could occur if the control gate depleted are mitigated. For example, a memory cell having a control gate that is at least partially p-type polysilicon might be programmed with a lower Vpgm than a memory cell formed from n-type polysilicon.

16 Claims, 20 Drawing Sheets

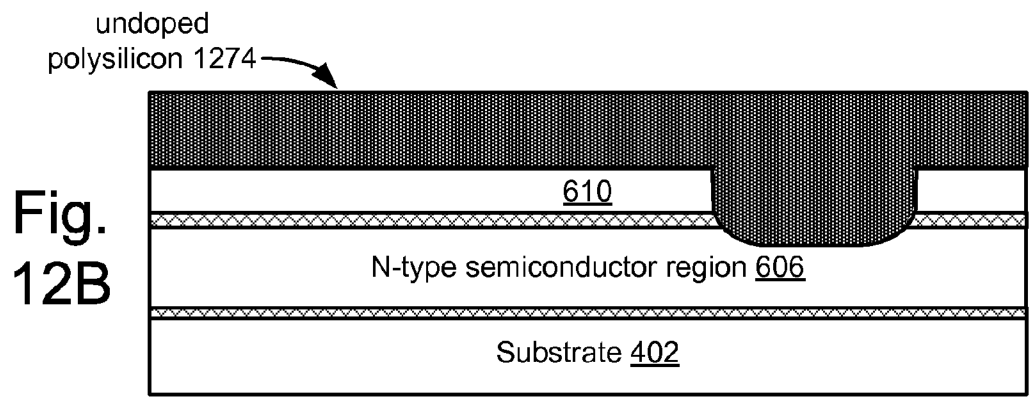
undoped
polysilicon 1274
Fig.
12B
610
N-type semiconductor region 606
Substrate 402
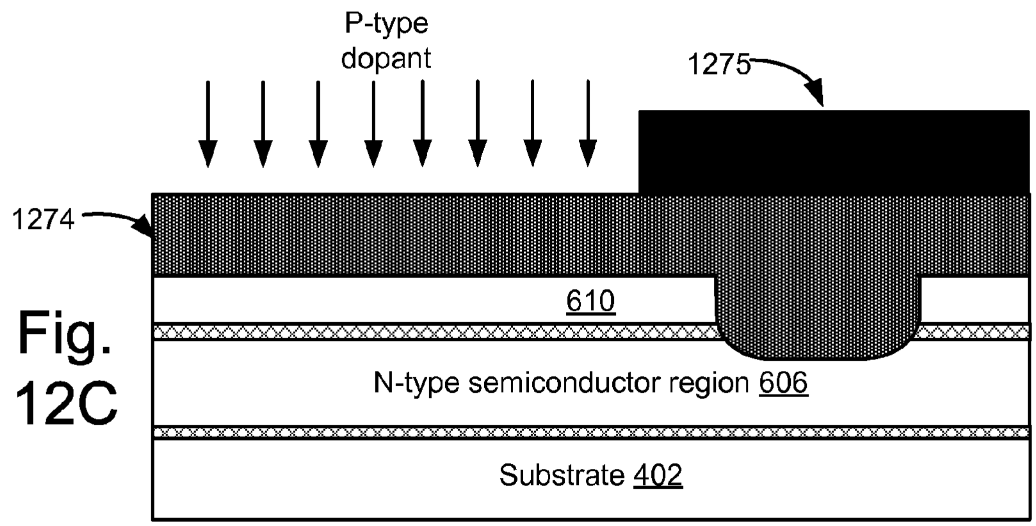
P-type
dopant
1275
1274
Fig.
12C
610
N-type semiconductor region 606
Substrate 402
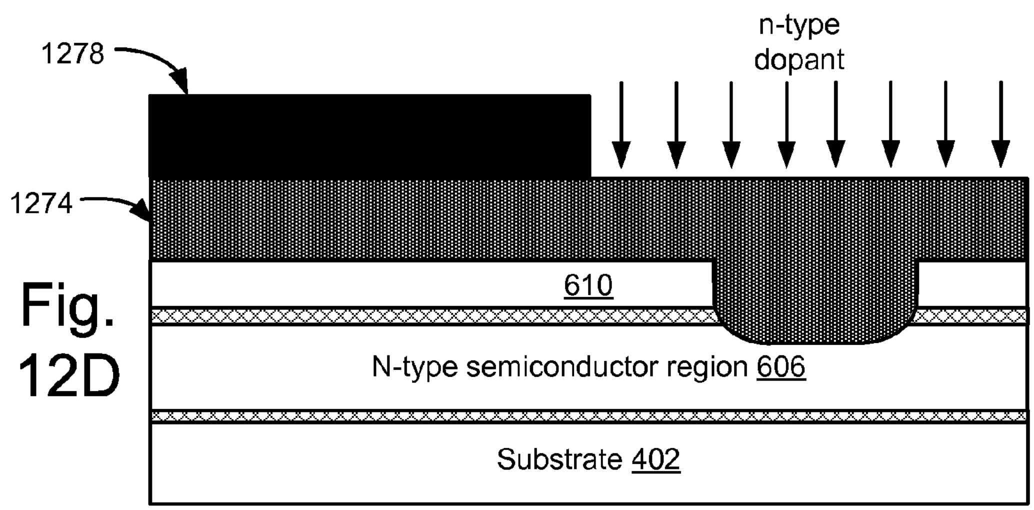
1278
n-type
dopant
1274
Fig.
12D
610
N-type semiconductor region 606
Substrate 402

P-TYPE CONTROL GATE IN NON-VOLATILE STORAGE AND METHODS FOR FORMING SAME

PRIORITY

This application claims the benefit of U.S. Provisional Application No. 61/327,027, entitled "P-Type Control Gate in Non-Volatile Storage and Methods for Forming Same," by Orimoto et al., filed on Apr. 22, 2010, incorporated herein by reference.

BACKGROUND

This disclosure relates to non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step.

Both traditional EEPROM and flash memory may utilize a floating gate that is positioned above and insulated from a channel region in a semiconductor substrate. The floating gate is positioned between the source and drain regions. A control gate ("control gate") is provided over and insulated from the floating gate ("floating gate"). The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ is applied to the control gate during a program operation as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations may be carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, $V_{PGM}$ may be applied to the control gate and the bit line may be grounded, causing electrons from the channel of a cell or memory element to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

Many challenges exist in successfully programming memory cells.

BRIEF DESCRIPTION OF THE DRAWINGS

FIGS. 12B, 12C, and 12D depict results after various steps of the process of FIG. 12A.

DETAILED DESCRIPTION

Disclosed herein are non-volatile storage devices and methods for fabricating non-volatile storage. In some embodiments, at least a portion of the control gates of non-volatile storage elements are formed from p-type polysilicon. In one embodiment, a lower portion of the control gate is p-type polysilicon. The upper portion of the control gate could be p-type polysilicon, n-type polysilicon, metal, metal nitride, etc. P-type polysilicon in the control gate may not deplete even at high Vpgm. Therefore, a number of problems that could occur if the control gate depleted are mitigated. For example, a memory cell having a control gate that is at least partially p-type polysilicon might be programmed with a lower Vpgm than a memory cell formed from n-type polysilicon.

Also note that techniques described herein allow various transistors to be fabricated during the same process steps as the memory cells. For example, select gate transistors and periphery transistors can be formed along with the memory cells. In some embodiments, the lower portion of the control gates of the transistors is formed from the same material as the floating gates, which may be an n-type semiconductor. The upper portion of the control gates of the transistors may be formed from the same material as an upper portion of the control gates of the memory cells. However, since a p-type semiconductor is used in at least a portion of the control gates of the memory cells, problems might occur if this p-type material were used in the control gates the transistors. Numerous techniques are described herein to avoid such problems.

Figure 1:
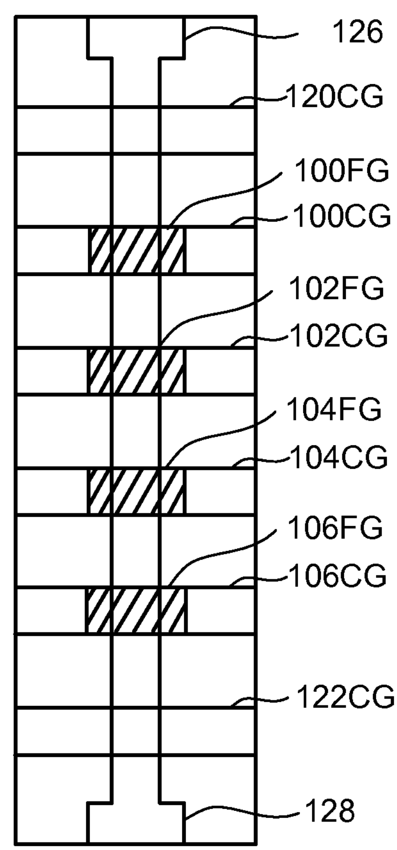
FIG. 1 is a top view of a NAND string.

The techniques described herein are applicable to wide range of memory arrays having memory cells for storing a single bit per cell and memory cells for storing multiple bits per cell. The following is one example NAND architecture. However, techniques described herein are not limited to this example. One example of a flash memory system uses the NAND structure, which includes arranging multiple floating gate transistors in series between two select gates. The transistors in series and the select gates are referred to as a NAND string. FIG. 1 is a top view showing one NAND string. The NAND string depicted in FIG. 1 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
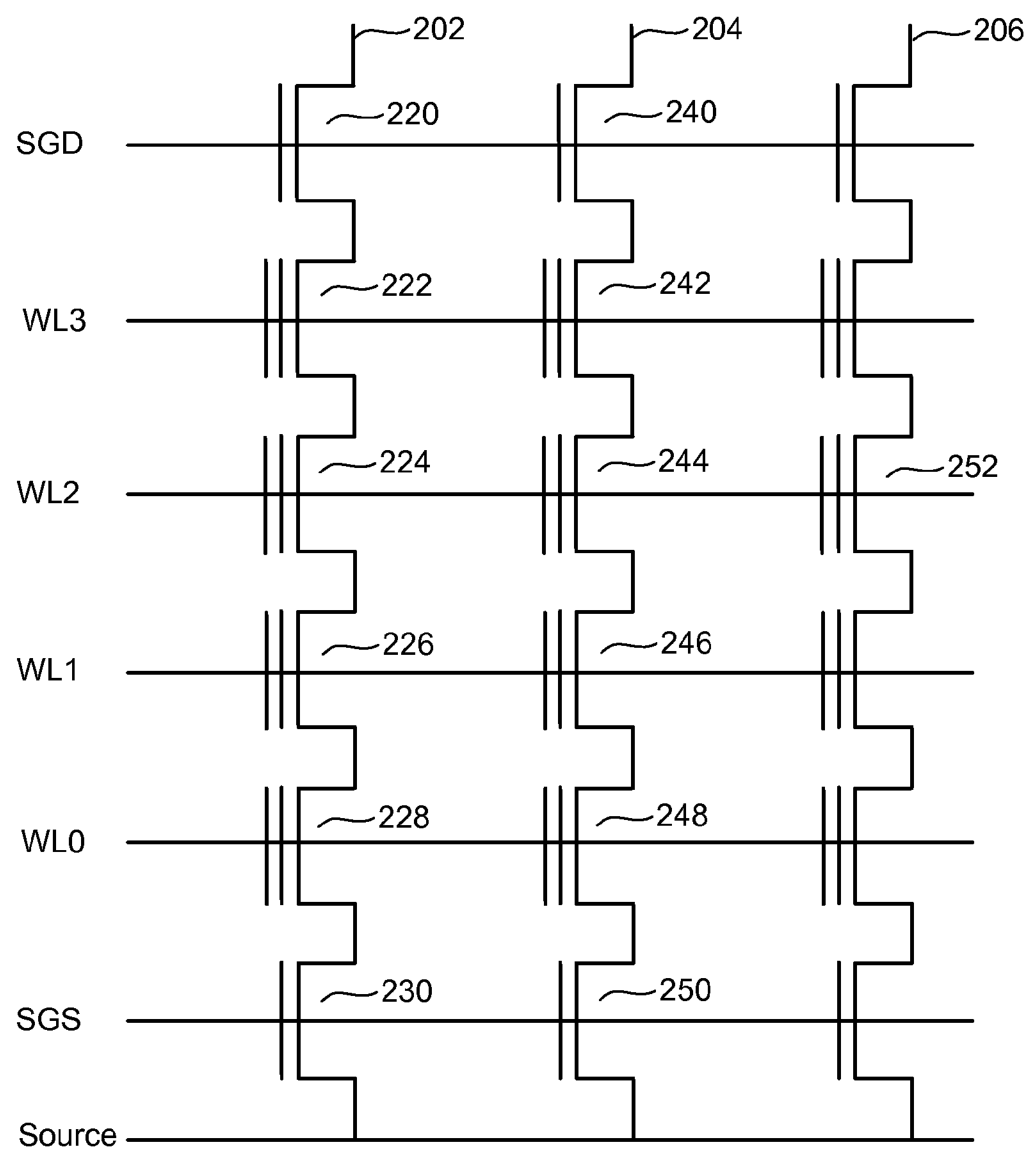
FIG. 2A is a circuit diagram of three NAND strings with associated word lines.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array.

Figure 2B:
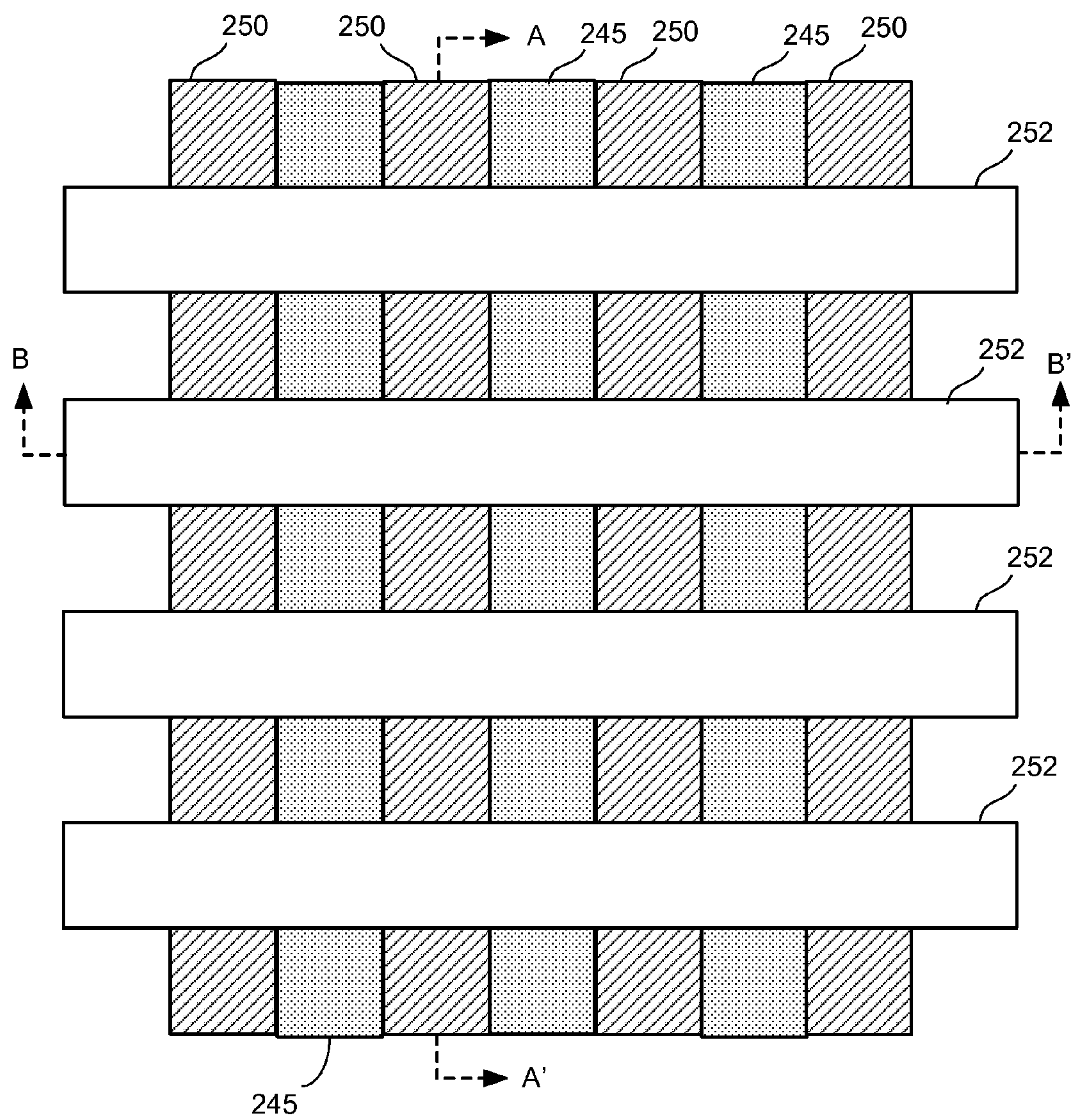
FIG. 2B is a top view of the three NAND strings and word lines.

FIG. 2B is a top view of a portion of an array of NAND flash memory cells. The array includes bit lines 250 and word lines 252. Shallow trench isolation (STI) structures 245 are depicted between the bit lines 250 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00."

In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory. For example, the following patents describe NOR type flash memories and are incorporated herein by reference in their entirety: U.S. Pat. Nos. 5,095,344; 5,172,338; 5,890,192 and 6,151,248.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Non-volatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

In some conventional devices, the control gate of memory cells is n-type polysilicon. However, an n-type polysilicon control gate may deplete at high Vpgm. For example, there may be electron depletion in the control gate. In some devices, a portion of the control gate may extend downward between two floating gates. Depletion may occur for some devices at the bottom of the control gate between two floating gates. Depletion may occur at other locations for other devices. When depletion occurs, the coupling ratio may fall, resulting in the need for a higher and higher Vpgm to avoid early Vt saturation and to program the memory cell to a high Vt. Depletion can be worse for devices with smaller device geometries. Therefore, as devices become smaller, depletion may become worse. Note that for n-type memory cell control gates, there may be electron depletion in the selected word line. As Vpgm increases, the electron depletion may become worse. This may result in a potential drop in the bottom tip of the control gate finger that is between two floating gates.

During programming, memory cells that reach their intended state may be inhibited from further programming. Such cells are referred to as inhibited cells. For some conventional devices with an n-type control gate, inhibited cells may experience less or no control gate depletion. As a result, inhibited cells may experience more program disturb as memory cells that are slowed by control gate depletion are programmed.

Typically, there is a dielectric layer between the floating gate and control gate. This dielectric layer is commonly referred to as an inter-poly-dielectric (IPD). For some devices, the IPD has its highest curvature at the top of the floating gate. Therefore, the electric field may be highest at the top of the floating gate. Consequently, IPD back-tunneling (also referred to as floating gate-to-control gate back-tunneling) may occur at the top of the floating gate. For some devices, it is believed that control gate depletion does not reduce the floating gate-to-control gate back-tunneling for a given Vpgm.

The foregoing indicates that higher programming voltages may be needed to overcome effects of control gate depletion for conventional cells with n-type control gate. However, generating and passing high Vpgm may be a problem for circuits on the periphery of the memory array ("periphery circuits"). Dielectric breakdown may also occur from WL-to-WL at high Vpgm.

The following few paragraphs describe some possible characteristics of embodiments of memory cells having p-type control gates, along with comparison to some conventional memory cells having n-type control gates. In some embodiments, at least a lower portion of the memory cell control gate is p-type (see, for example, FIGS. 4A-4F). In some embodiments disclosed herein, a memory cell having a p-type control gate may program to a higher Vt than a memory cell having an n-type control gate. Therefore, the Vt window may be improved by using devices with p-type control gate polysilicon, as compared to n-type control gate polysilicon. The floating gate charge versus Vpgm may also be improved by using p-type control gate, as compared to n-type control gate polysilicon.

Memory cells with a p-type control gate may having different floating gate-control gate capacitance during programming, compared to n-type control gates. For example, with an n-type control gate, the capacitance may fall with increasing Vpgm. This may be due to increasing depletion. However, with a p-type control gate, the capacitance may increase with increasing Vpgm. For low Vpgm, the floating gate-control gate capacitance may be smaller than for an n-type control gate. This may be due to the floating gate being so positively charged that it has a higher potential than the control gate; therefore, a small amount of control gate depletion may be present. However, with increasing Vpgm, the floating gate-control gate capacitance for the p-type control gate may become much larger than for an n-type control gate. Even at fairly low Vpgm (e.g., 10V), the floating gate-control gate capacitance of the p-type control gate may be greater than the n-type control gate. In some embodiments using a p-type control gate, there may be some depletion of unselected word lines at high Vpgms, which may increase the capacitance of the selected word line.

In some embodiments having p-type control gates, as Vpgm increases, the unselected WL may become depleted of holes. In some embodiments, increasing Vpgm may push holes away from the unselected WL until the control gate becomes depleted. Even if Vpass on the unselected WLs is constant as Vpgm increases, the potential on the unselected WL can swing slightly, which may result in a higher selected WL to selected floating gate capacitance. Note that air gaps between the WLs might reduce these control gate-to-control gate effects.

In some embodiments having p-type control gates, there may be some band banding in unselected WLs. As mentioned, the unselected WL may become depleted (this may be the case due to relatively light doping). In some embodiments having p-type control gates, as Vpgm is increased, there may be a greater potential drop from bottom to top of unselected control gate. For example, there may be a potential drop across the slightly depleted polysilicon of the unselected control gate. This effect may increase Vpass disturb. Therefore, in one embodiment, a slightly lower Vpass is applied to WLn+1. A reason for this is that the Vpass disturb may affect cells on WLn+1 and WLn−1 more than others on the same bit line. However, memory cells on WLn−1 may not be as vulnerable to the Vpass disturb. Therefore, a lower Vpass might not be needed for WLn−1.

Figure 3:
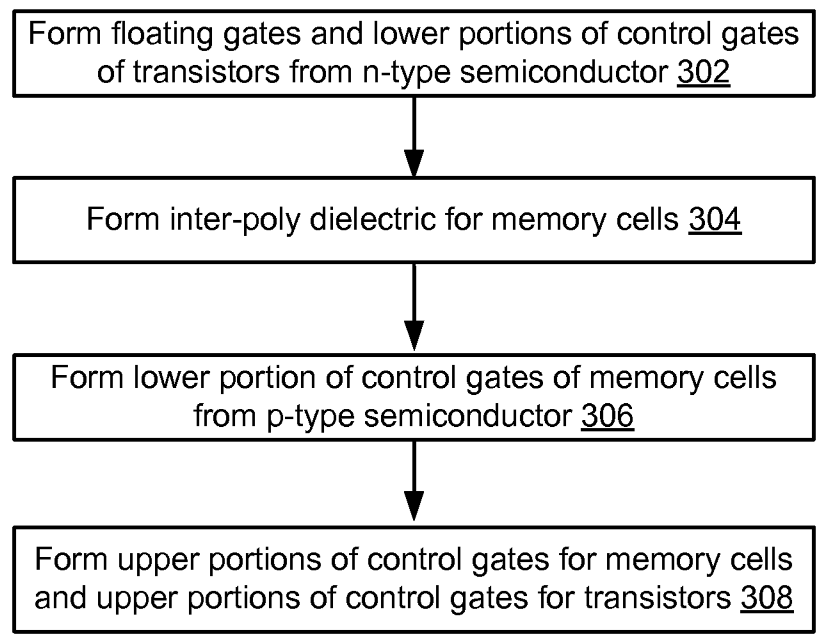
FIG. 3 is a flowchart describing one embodiment of fabricating a portion of a memory array.

FIG. 3 is a flowchart describing one embodiment of a process 300 of fabricating a portion of a memory array. This flowchart does not describe all implant steps, the gap fill of etched volumes between the floating gate stacks, or forming the contacts, metallizations, vias, and passivation, as well as other portions of the manufacturing process known in the art. For example, the formation of shallow trench isolation structures (STI) that may separate NAND strings are not discussed. There are many ways to manufacture memory according to embodiments and, thus, the inventors contemplate that various methods other than that described by FIG. 3 can be used. While a flash memory chip will include core memory and peripheral circuitry, the process steps of FIG. 3 are intended only to describe in general terms one possible process recipe for the fabrication of the floating gate stacks. For example, the floating gates can be formed to have many different shapes. In some embodiments, the floating gates have a relatively wide base with a relatively narrow stem above the base.

In step 302, floating gates of memory cells and lower portions of control gates of transistors are formed from an n-type semiconductor such as, but not limited to polysilicon. This will be described in more detail below. Briefly, polysilicon may be deposited (doped as deposited or doped later). At some later point (possibly after adding other materials), etching may be performed to form the floating gates and lower portions of control gates. Note that this etching might also form control gates of memory cells and transistors.

In step 304, an inter-poly dielectric for the memory cells is formed. This will be described in more detail below. As one example, one or more layers of silicon-dioxide and silicon nitride (together commonly referred to as "ONO") may be formed over the material from which the floating gates are to be formed. The inter-poly dielectric could be a material other than ONO.

In step 306, lower portions of control gates for memory cells are formed from a p-type semiconductor such as, but not limited to polysilicon. This will be described in more detail below. In one embodiment, polysilicon may be deposited (doped as deposited or doped later). At some later point, etching may be performed to form the lower portions of control gates (possibly after adding material for the upper portion of control gates for memory cells). Note that this etching might be the same etching that was discussed in step 302 to also form control gates of memory cells and transistors.

In step 308, upper portions of the control gates for the memory cells and upper portions of control gates for transistors are formed from the same material. Step 308 may include depositing the material for the upper portions of the control gates for the memory cells and upper portions of control gates for transistors in the same process step. In some embodiments, the material that is deposited is un-doped polysilicon. In some embodiments, the material that is deposited is n-doped polysilicon. In some embodiments, the material that is deposited is p-doped polysilicon. In some embodiments, the same material (e.g., polysilicon is used to form the upper portions of the control gates for the memory cells and upper portions of control gates for transistors; however, this material may be doped differently for the memory cells than for the transistors. For example, counter-doping of either the memory cells or transistors may be performed. In some embodiments, the material that is deposited is a metal or a metal nitride. In some embodiments, the previously mentioned etching of steps 302 and 306 is used to form the upper portions of the control gates for the memory cells and upper portions of control gates for transistors.

Figure 4A:
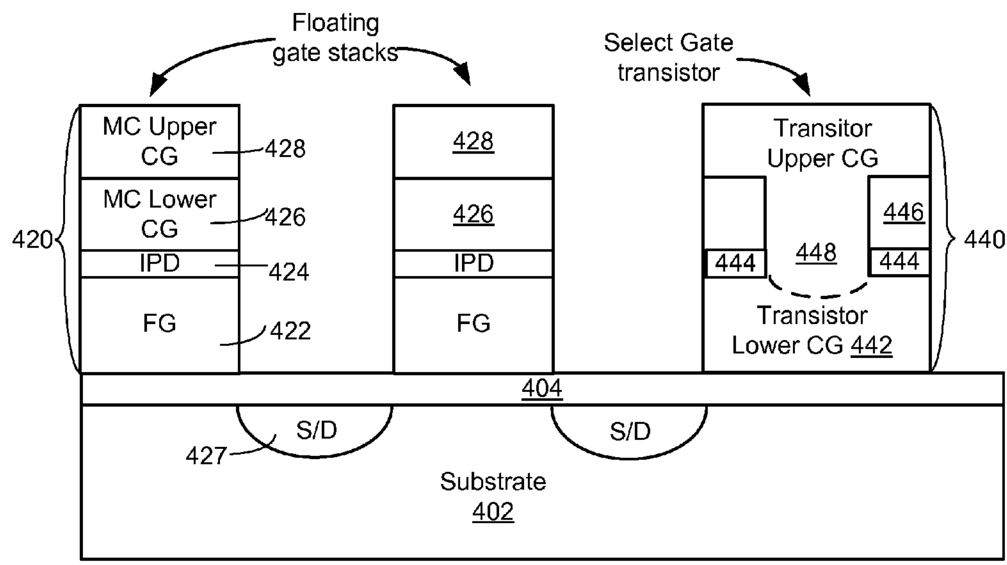
FIGS. 4A-4F depict various embodiments of memory cells and transistors that may be formed using the process of FIG. 3.
Figure 4D:
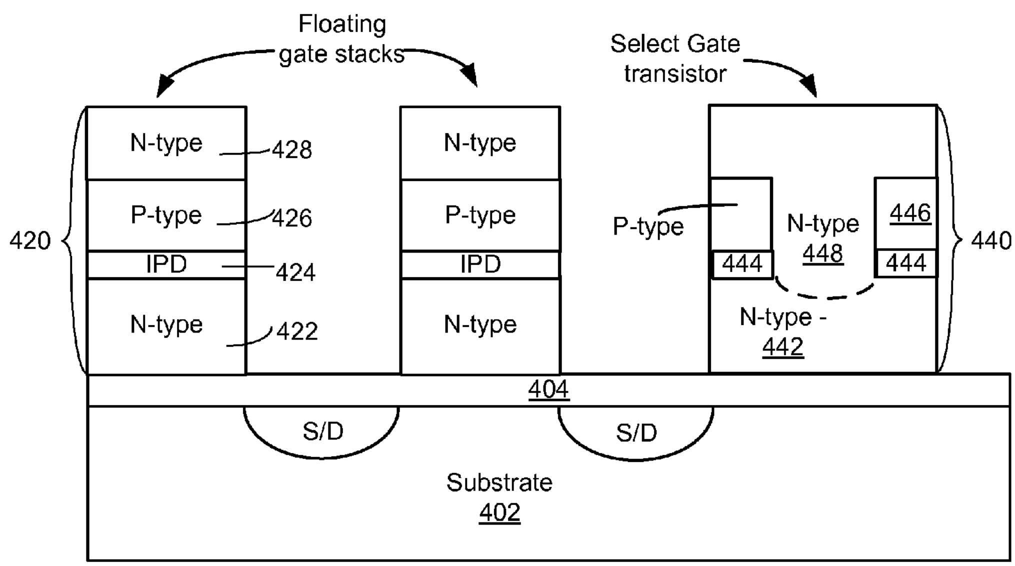
Figure 4B:
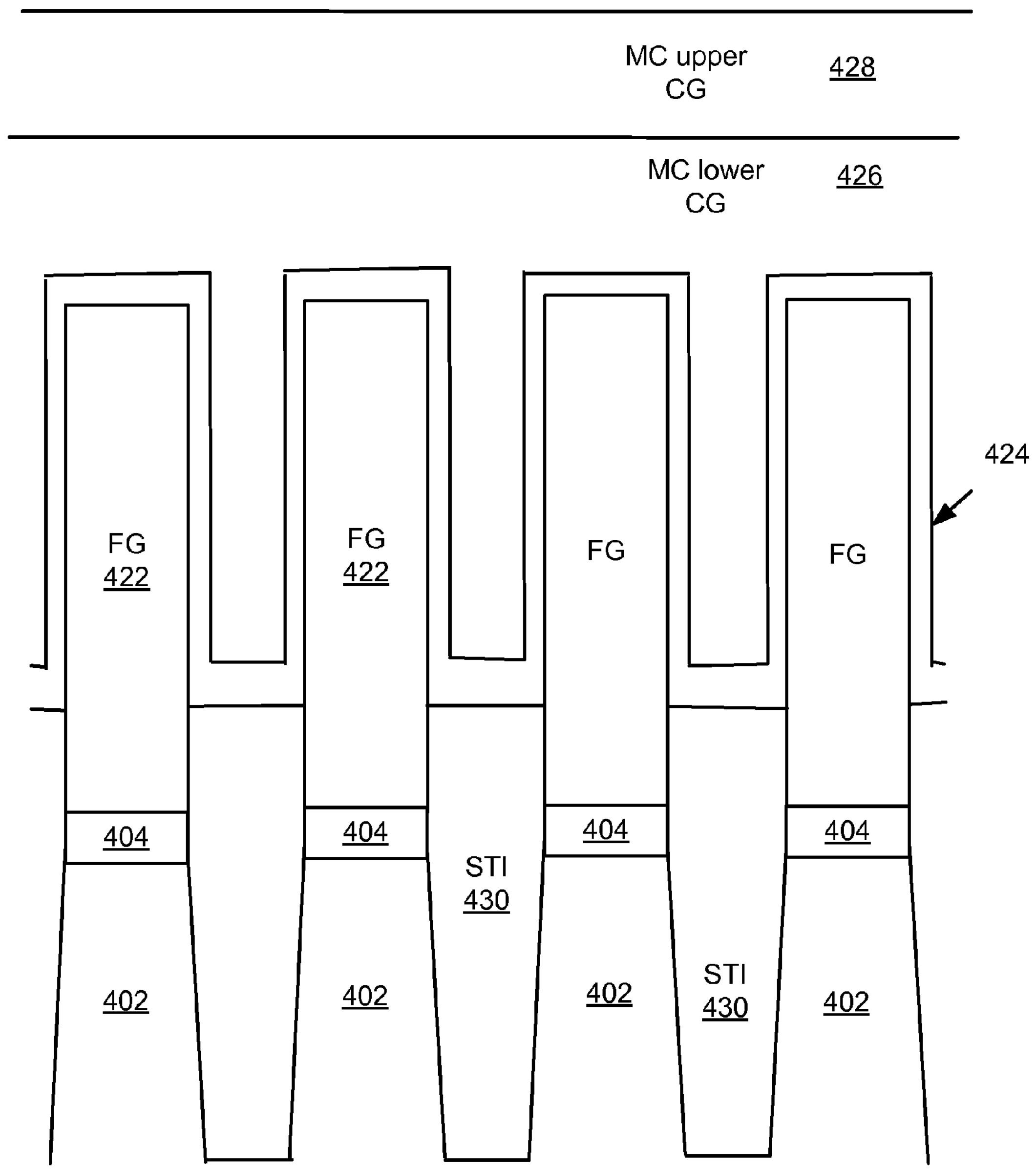
Figure 4C:
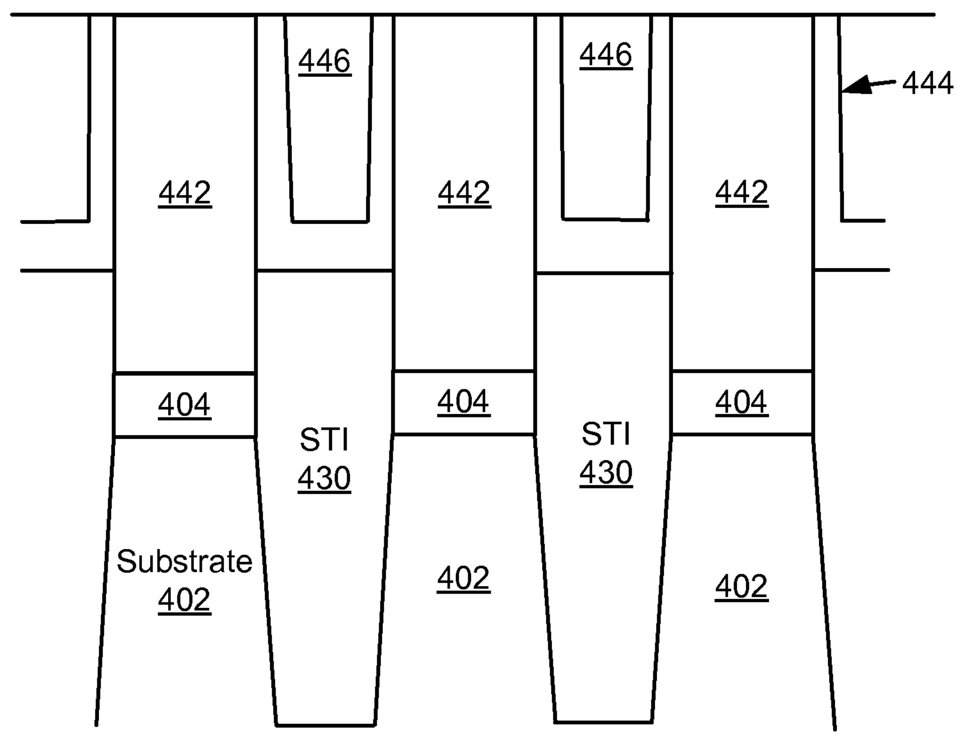

FIGS. 4A-4F depict various embodiments of memory cells and transistors that may be formed using the process of FIG. 3. However, note that forming the structures of FIGS. 4A-4F are not limited to the process of FIG. 3. FIGS. 4A-4C depict different perspectives of one embodiment. FIG. 4A depicts a cross sectional along a portion of a NAND string. For example, line A-A' in FIG. 2B runs in the direction along a NAND string. Note that 4A is not an exact cross section of line A-A' of FIG. 2B. Specifically, two floating gate memory cell stacks 420 and one select gate transistor stack 440 are depicted in FIG. 4A. FIG. 4B depicts a cross sectional in the direction of a word line, and shows several memory cells. For example, line B-B' in FIG. 2B runs in the direction along a word line. FIG. 4C depicts a cross sectional in the direction of a word line, and shows several transistors.

The following discussion pertains to the embodiment of FIGS. 4A-4C. The floating gate memory cell stack 420 includes a floating gate (FG) 422, memory cell inter-poly dielectric (IPD) 424 (also referred to as inter-gate dielectric), a lower portion of memory cell control gate (MC lower CG) 426, and upper portion of memory cell control gate (MC upper CG) 426. Portions of the transistor stack 440 may be formed from similar materials used to form the floating gate stacks 420, as will be discussed in more detail below. Specifically, transistor lower CG 442 may correspond (in terms of materials used to form) to the floating gate 422; select gate transistor IPD 444 may correspond to the memory cell IPD 424; transistor upper CG 448 may correspond to the MC upper CG 428, transistor region 446 may correspond to MC lower CG 426. However, note that the transistor upper CG 448 may extend further down into the transistor stack 440 than the MC upper CG 428. Further details of forming the stacks 420, 440 of FIG. 4A are discussed below in connection with the process flow of FIG. 5. FIG. 4A also shows source/drain regions 427 in the substrate 402. FIGS. 4B and 4C also show shallow trench isolation (STI) structures 430 in the substrate 402.

Figure 4E:
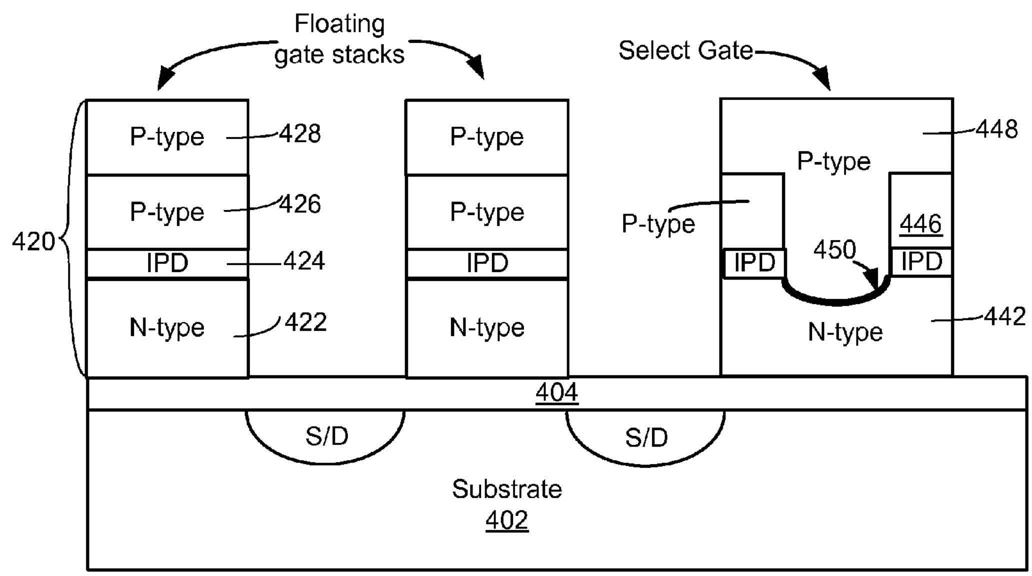
Figure 4F:
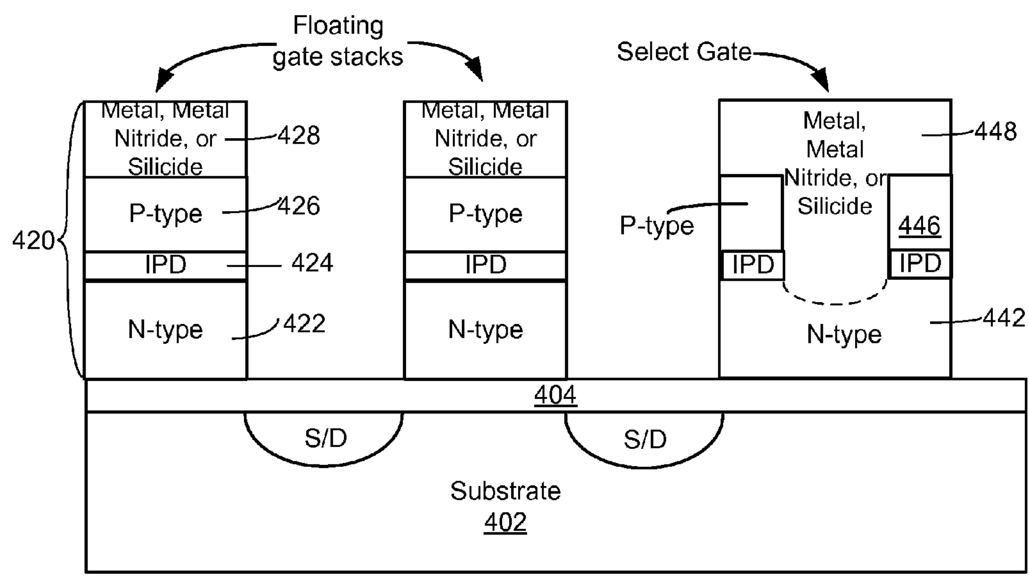

In some embodiments, the floating gates 422 are formed from n-type material. Therefore, transistor lower CG 442 may also be formed from n-type material. In some embodiments, the MC lower CG 426 are formed from p-type material. Therefore, transistor region 446 may also be formed from p-type material. The selection of material for MC upper CG 428 and, therefore, transistor upper CG 448 varies from one embodiment to the next. FIGS. 4D, 4E, and 4F depict several different embodiments.

In the embodiment of FIG. 4D, the floating gate 422 may be formed from n-type polysilicon. The lower portion of memory cell control gate 426 may be formed from p-type polysilicon. The upper portion of memory cell control gate 428 may be formed from n-type polysilicon. Portions of the transistor stack 440 may be formed from similar materials used to form the floating gate stacks 420, as will be discussed in more detail below. Specifically, select gate lower polysilicon region 442 may correspond to the floating gate 422; select gate transistor IPD 444 may correspond to the memory cell IPD 424; select gate upper polysilicon region 446 may correspond to the lower portion of the memory cell control gate 426; and upper portion 448 of control gate of transistor may correspond to the upper portion 426 of the control gate of the memory cell. However, note that the and upper portion of control gate of transistor 448 may extend further down into the transistor stack 440 than the upper portion of the control gate 428. Further details of forming the stacks 420, 440 of FIG. 4D are discussed below in connection with the process flow of FIG. 5. Note that in this embodiment, the control gate of the transistor has a continuous region of n-type semiconductor from the bottom to the top. A dashed line is depicted between transistor lower CG 442 and transistor upper CG 448 to highlight the different regions being discussed.

FIG. 4E depicts an embodiment in which both the lower 426 and upper portions 428 of the control gate of the memory cells are formed from p-type semiconductor. Note that in some embodiments, material for the lower 426 and upper 428 portions are deposited separately; although this is not required. In FIG. 4E, the upper portion 448 of the control gate of the transistor is formed from p-type semiconductor. However, there is a conductive barrier layer 450 between the n-type semiconductor and the p-type semiconductor in the control gate of the transistor. The conductive barrier 450 may alleviate problems that might otherwise occur with a p-n junction in the control gate of the transistor. Further details of forming the structure of FIG. 4E are discussed below.

FIG. 4F depicts an embodiment in which the upper portions 428 of the control gates of the memory cells are formed from metal, metal nitride, or silicide. Moreover, the upper portion 448 of the control gate of the transistor is formed from metal, metal nitride, or silicide. Therefore, the control gate of the transistor has an n-type semiconductor in region 442 in contact with the metal in region 448. However, whatever p-type material (e.g., region 446) that may be in the control gate of the transistor does not create a p-n junction that might interfere with operation. Further details of forming the structure of FIG. 4F are discussed below.

Figure 5:
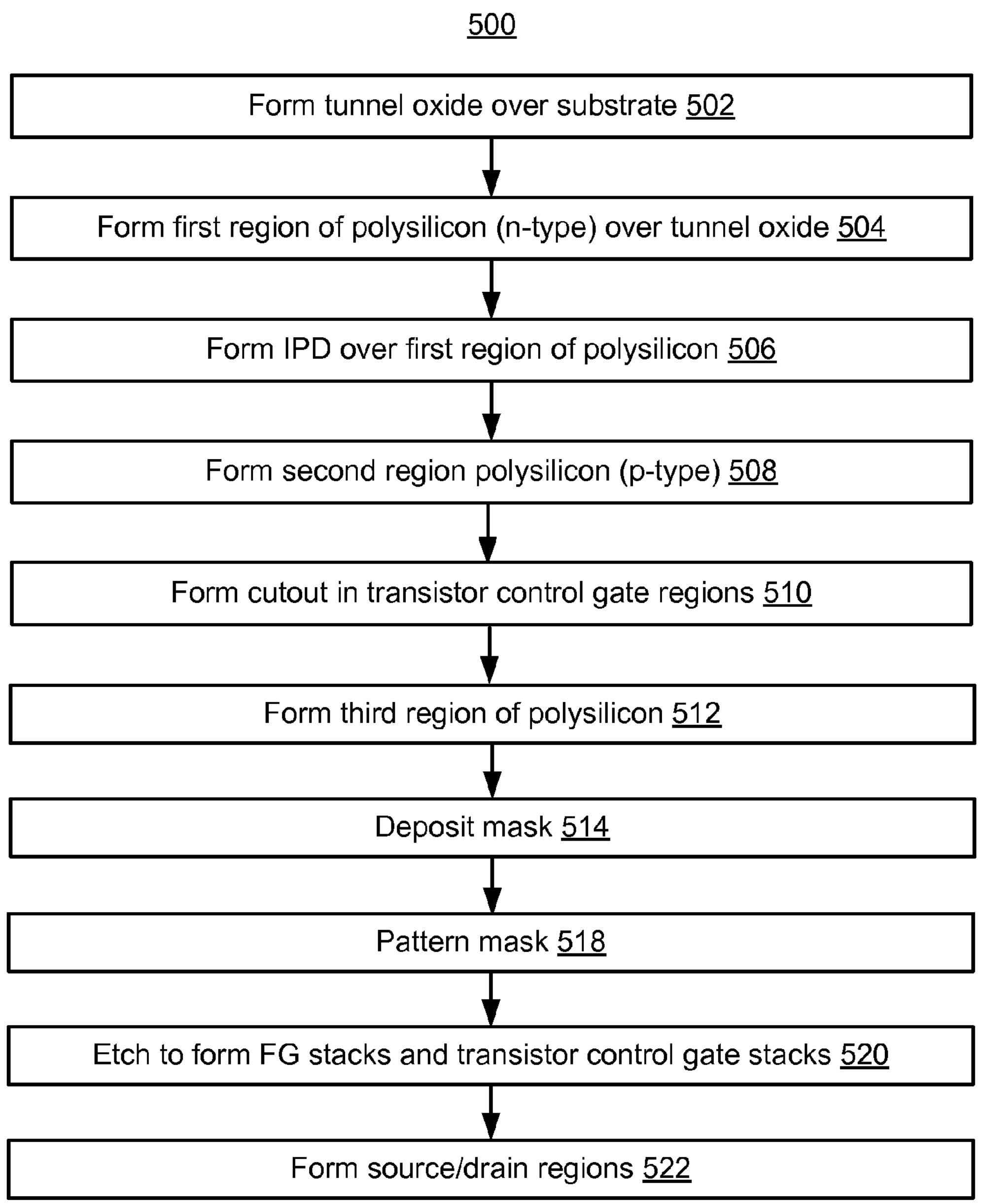
FIG. 5 is a flowchart describing one embodiment of fabricating a portion of a memory array.

FIG. 5 is a flowchart of one embodiment of a process 500 for forming portions of the memory array. Process 500 may be used, in part, to form the structures of FIG. 4A-4E. Forming the structure of FIG. 4F (which has metal, metal nitride, or silicide for MC upper CG 428 and transistor upper CG 448) will be described later. Process 500 provides more details for the process 300 of FIG. 3. FIGS. 6A-6D, which show details after various steps of formation, will be referred to when discussing process 500. FIGS. 6A-6D show formation of two floating gate stacks and a transistor stack, and have a similar cross sectional perspective as FIGS. 4D and 4E.

In step 502, a tunnel of gate oxide layer is formed over a substrate. The tunnel oxide may be grown or deposited over the substrate. In step 504, a first region polysilicon is formed for eventual formation of floating gates. This first region polysilicon may be n-type polysilicon. This first region of polysilicon may also be used for a lower portion of gates of transistors, such as select gate and periphery transistors. The polysilicon may be deposited using CVD, PVD, ALD or another suitable method. In some embodiments, the polysilicon is doped in-situ. In some embodiments, the polysilicon is doped later. For example, one or more impurities are implanted after the polysilicon is deposited. In some embodiments, the polysilicon is doped with an n-type donor. For example, the polysilicon may be doped with arsenic or phosphorus.

In step 506, an inter-poly dielectric (IPD) layer is formed. In some embodiments, the IPD is formed from multiple layers of materials. For example, the IPD may be what is commonly referred to as ONO, which includes alternating conformal layers of silicon dioxide ("O") and silicon nitride ("N"). In one embodiment, the IPD comprises nitride-oxide-nitride-oxide-nitride.

Figure 6A:
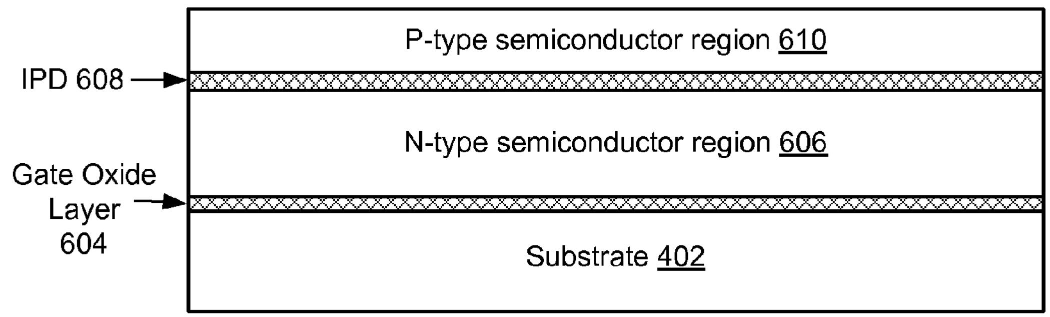
FIGS. 6A, 6B, 6C, and 6D depicts results after various step of the process of FIG. 5.

In step 508, a second region of polysilicon is formed to be used for lower portions of control gates of memory cells. This second region of polysilicon may be p-type polysilicon. In some embodiments, a p-type impurity is added in situ. In some embodiments, the polysilicon is deposited un-doped. Later a p-type impurity is added. For example, boron may be added either in-situ while depositing the polysilicon or implanted later. FIG. 6A shows results after step 508. FIG. 6A shows a cross section along what will be a portion of a NAND string. FIG. 6A shows a substrate 402, gate oxide layer 604, n-type semiconductor region 606, IPD layer 608, and p-type semiconductor region 610.

Figure 6B:
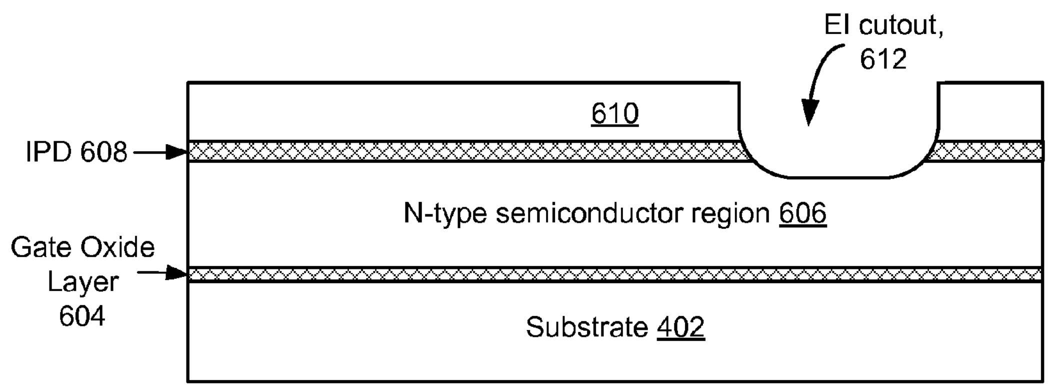

In step 510, a control gate/IPD cutout is made in regions in which control gates of transistors (e.g., select gate transistors) will be formed. The cutouts may also be formed in regions where control gates of periphery transistors will be formed. A reason for these cutouts is to form control gates that do not have the IPD forming a barrier. In other words, whereas memory cells have a floating gate that is separated from the control gate by the IPD, control gates of transistors should not have a floating gate. Therefore, a portion of the IPD is removed where select gates and other transistors will be formed. FIG. 6B shows results after step 510. FIG. 6B depicts the cutout region 612 in which a portion of the p-type semiconductor region 610 has been removed, a portion of the IPD layer 608 has been removed, and a portion of the n-type semiconductor region 606 has been removed. In some embodiments, etching is performed to create the cutout 612.

Figure 6C:
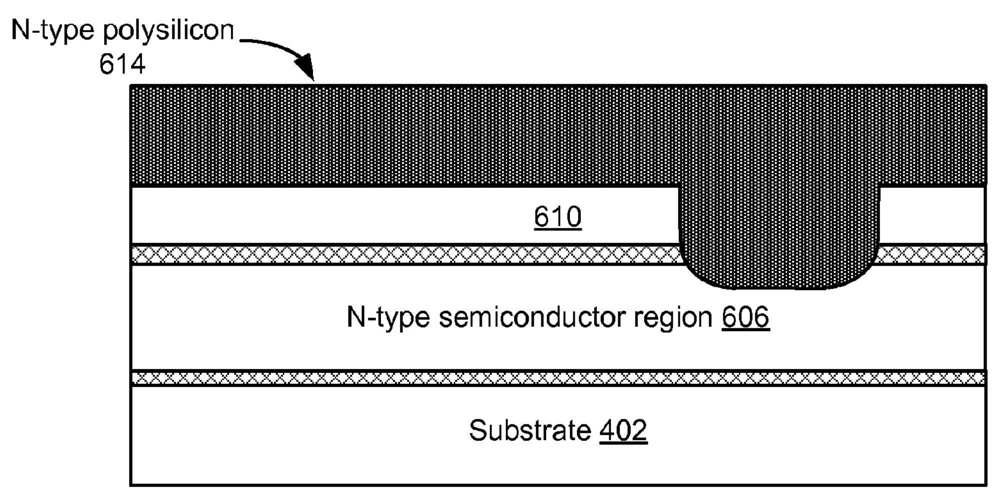

In step 512, a third region of polysilicon is formed to be used for upper portions 428 of control gates of memory cells, as well as upper portions 448 of control gates of transistors. In some embodiments, this third region of polysilicon is p-type polysilicon. Therefore, both the upper 428 and lower portions 426 of the control gates of memory cells may be p-type. In some embodiments, this third region of polysilicon is n-type. In some embodiments, the polysilicon is doped in-situ. In some embodiments, the polysilicon is deposited un-doped. Later one or more impurities are added. For example, boron or arsenic may be added either in-situ while depositing the polysilicon or implanted later. FIG. 6C depicts results after step 512 for one embodiment in which the third region is n-type polysilicon 614. The n-type polysilicon 614 has been deposited into the EI cutout 612 as well as over the p-type semiconductor region 610 that will be used for lower portions of control gates of memory cells.

In step 514, a mask layer is formed over the third region of polysilicon. In step 518, a pattern is formed in the mask such that etching can later be performed to create floating gate stacks and control gates or transistors. In one embodiment, a SiN hard mask is patterned as follows. SiN may be deposited over the entire third layer of polysilicon 614 using, for example, CVD. Next, a photoresist layer may be added over the SiN. The photoresist may be exposed and developed to form a mask pattern. The pattern is transferred to the SiN, thus forming the SiN hard mask. In step 520, floating gate stacks 420 and transistor stacks 440 are formed by etching based on the mask.

Figure 6D:
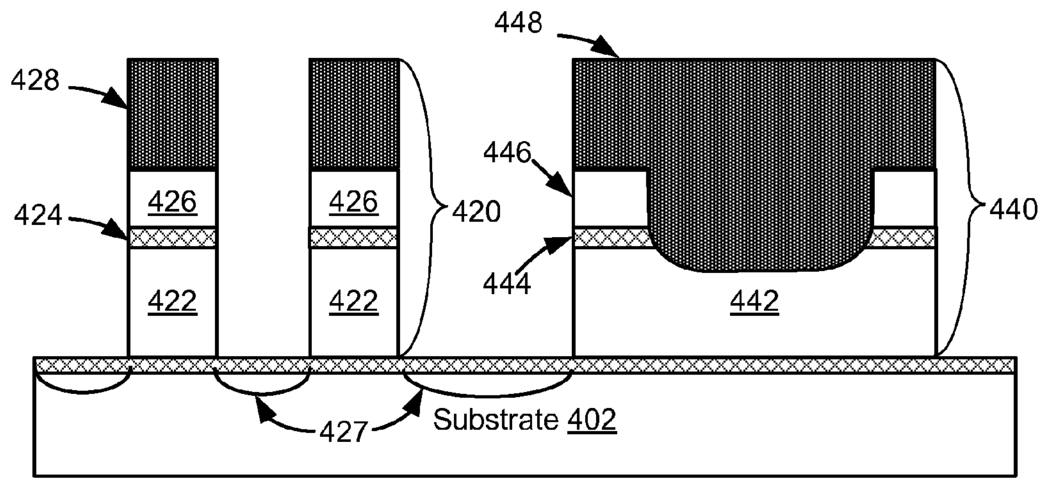

In step 522, doping may be performed to create source/drain regions 427 for memory cells, as well as a source and/or drain regions for transistors (e.g., select gate transistor, periphery transistors). The hard mask may remain in place while doping to create the source/drain regions. Later the hard mask may be removed. FIG. 6D depicts results after step 522 for one embodiment. FIG. 6D shows two floating gate stacks 420 for a respective two memory cells transistor stack and source/drain regions 427 in the substrate 402. Also depicted is a transistor stack 440. Note that there may be some IPD 444 remaining in the control gate of the transistor. Note that if the third region of polysilicon is n-type polysilicon, then the structure of FIG. 6D is similar to the structure of FIG. 4D. Note that if the third region of polysilicon is p-type polysilicon, then the structure of FIG. 6D is similar to the structure of FIG. 4E.

Note that steps 504, 514, 518, and 520 are one embodiment of forming floating gates 422 and transistor lower CG 442 of step 302 of FIG. 3. Note that steps 506, 514, 518, and 520 are one embodiment of forming inter-poly dielectric 424 of step 304 of FIG. 3. Note that steps 508, 514, 518, and 520 are one embodiment of forming MC lower CG 426 of step 306 of FIG. 3. Note that steps 510, 512, 514, 518, and 520 are one embodiment of forming MC upper CG 428 and transistor upper CG 448 of step 308 of FIG. 3.

Referring again to FIG. 4D, note that the majority of the select gate transistor is n-type. However, referring again to FIG. 4E, note that the select gate transistor has an upper portion 448 that is p-type and a lower portion 442 that is n-type. Recall that a reason for this it that the control gates for the memory cells were formed entirely from p-type polysilicon. It may be possible that the p-type doping in the select gate transistor might tend to counter-dope the n-type region of the select gate transistor; therefore, possibly altering transistor characteristics. In one embodiment, a conductive barrier 450 is placed between the upper 448 (n-type region) and the lower 442 (p-type region) in the control gates of transistors. FIG. 4E depicts a diagram of one embodiment with such a conductive barrier 450 between the n-type region and the p-type region. Recall that the n-type region of the select gate transistor was formed from the material used to form the floating gates and that the p-type region of the select gate transistor was formed from the material used to form the upper portions of the control gates. In this embodiment, the barrier layer 450 may help reduce or eliminate diffusion of the p-type dopant into the n-type region. Example materials for the barrier layer 450 include, but are not limited to, metals, metal nitrides, and silicides. Example metals include, but are not limited to, tungsten, titanium, and tantalum. Example metal nitrides include, but are not limited to, tungsten nitride, titanium nitride, and tantalum nitride.

Figure 7A:
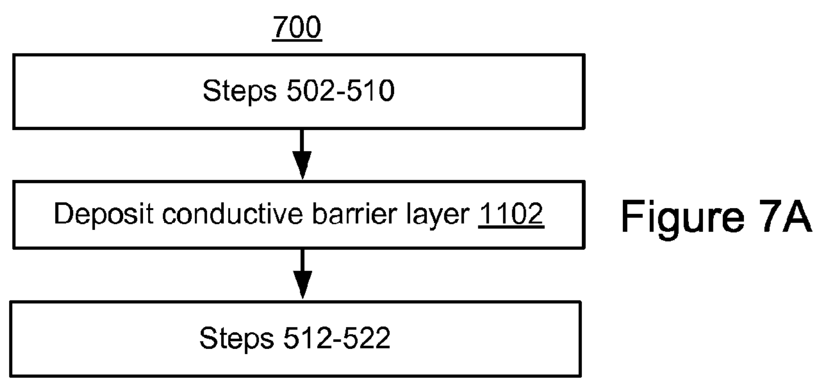
FIG. 7A is a flowchart describing a process of fabricating a memory cell with a conductive barrier layer between a p-type region and an n-type region in a control gate of a transistor.
Figure 7B:
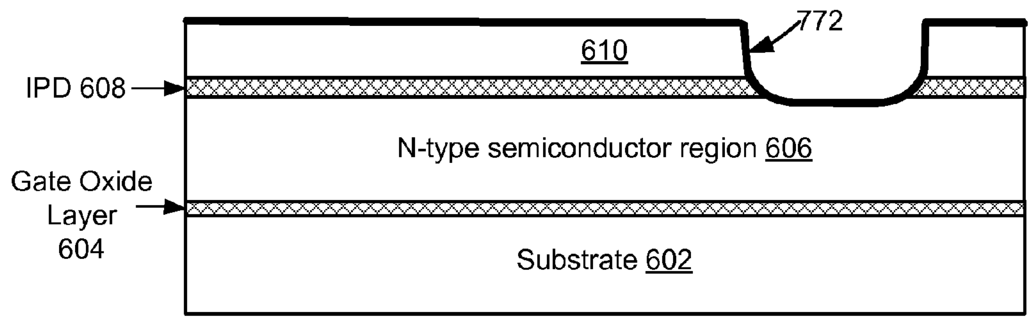
FIGS. 7B, 7C, and 7D depicts results after various step of the process of FIG. 7A.
Figure 7C:
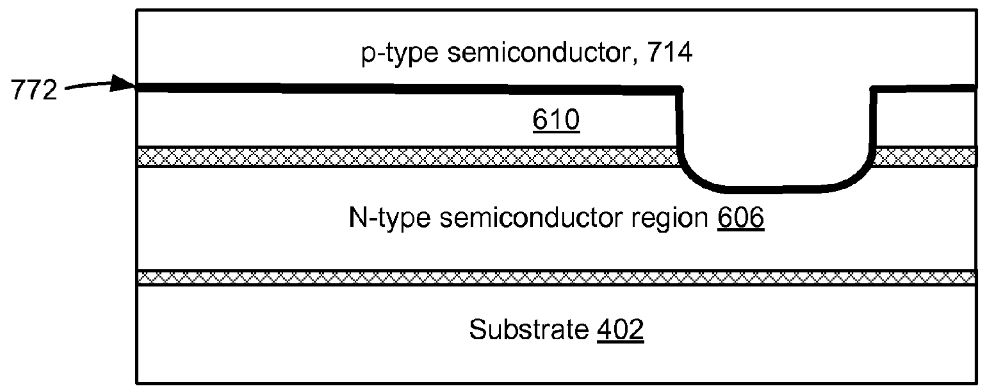
Figure 7D:
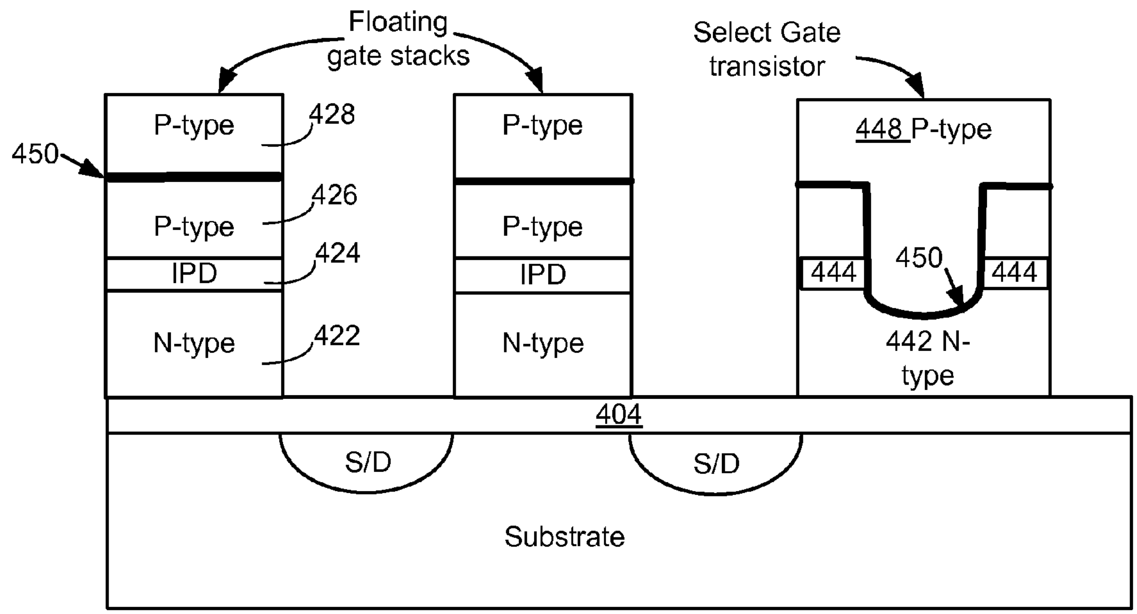

FIG. 7A is a flowchart of one embodiment of a process 700 of forming memory cells and transistors in which a conductive barrier layer 450 is used in the transistor control gates. FIGS. 7B-7D depict results after various steps in process 700. Initially, steps 502-510 of FIG. 5 may be used to form a structure such as the one depicted in FIG. 6B. A conductive barrier material is deposited in step 702. As examples, a metal or metal nitride may be deposited. A silicide may also be deposited. The conductive barrier material may cover the cutout region, as well as regions where the memory cells are to be formed. Therefore, the portions over the memory cell area may be removed by following steps. FIG. 7B depicts results after step 702, showing a conductive barrier material 772. Next, steps 512-522 of FIG. 5 may be performed to forming floating gate and transistor stacks. When forming the third region of polysilicon (step 512), a p-type region may be formed. Results after step 512 for one embodiment are depicted in FIG. 7C, which shows a p-type semiconductor 714 over the conductive barrier material 772. Results after forming the floating gate stacks (step 520) and source/drain regions (step 522) for one embodiment are depicted in FIG. 7D. In this embodiment, the barrier layer 450 separates the upper (p-type region) 448 from the lower (n-type region) 442 in the control gate of the transistor. The barrier layer 450 also resides over some of what was p-type region 610 that remains in the control gate of the transistor. Further, in this embodiment, the barrier layer 450 remains in the control gate of the memory cells; however, this is not required. Instead masking might be performed to prevent portions of the barrier layer 772 from covering the portions of region 610 where the memory cells are to be formed.

Figure 8A:
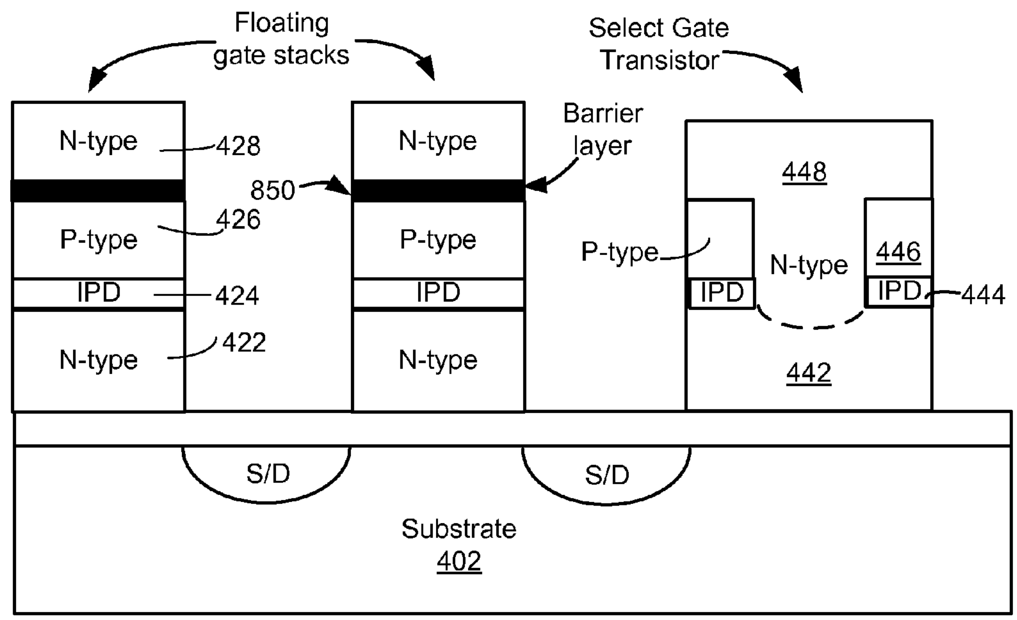
FIG. 8A depicts one embodiment having a conductive barrier layer between a p-type region and an n-type region in a control gate of a memory cell.

For embodiments in which the memory cell control gates include both a p-type region and an n-type region, there may concerns with the p-n junction in the memory cell control gate. In one embodiment, a conductive barrier layer is included between the p-type region and the n-type region of the memory cell control gate. Example materials for the barrier layer include, but are not limited to, titanium nitride, tantalum nitride, tungsten nitride, or a silicide. Example silicides include, but are not limited to tungsten silicide, titanium silicide and cobalt silicide. FIG. 8A depicts an embodiment showing a barrier layer 850 between a MC lower CG 426 (p-type region) and a MC upper CG 428 (n-type region).

Figure 8B:
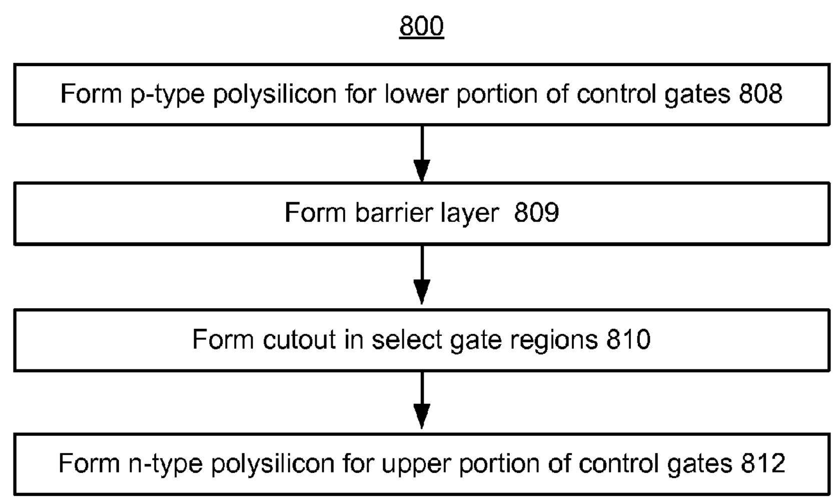
FIG. 8B is a flowchart describing a process of fabricating a memory cell depicted in FIG. 8A.
Figure 8C:
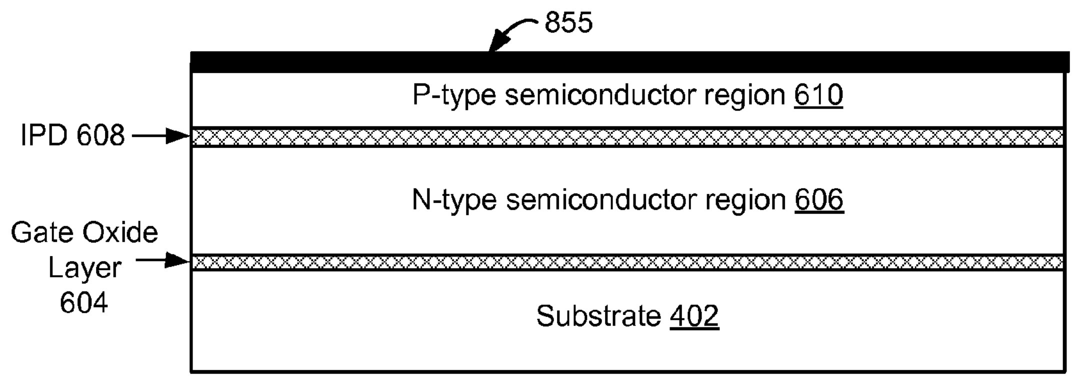
FIGS. 8C, 8D, and 8E depicts results after various step of the process of FIG. 8B.
Figure 8D:
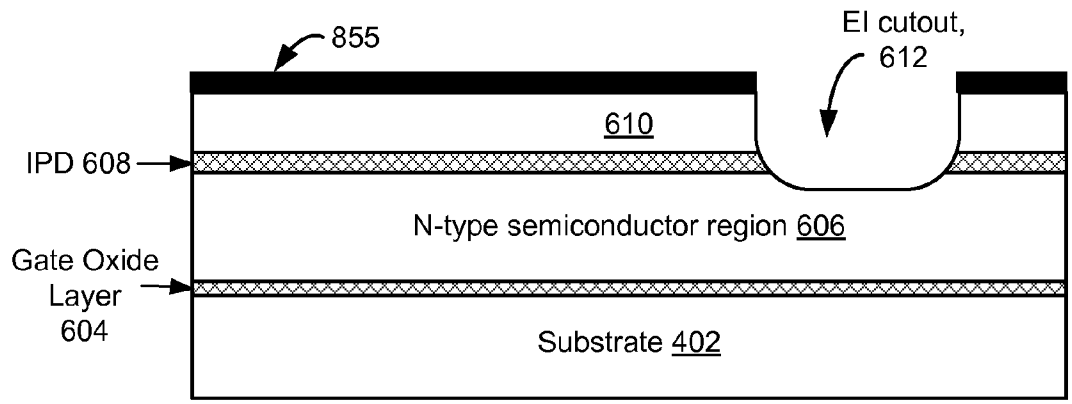
Figure 8E:
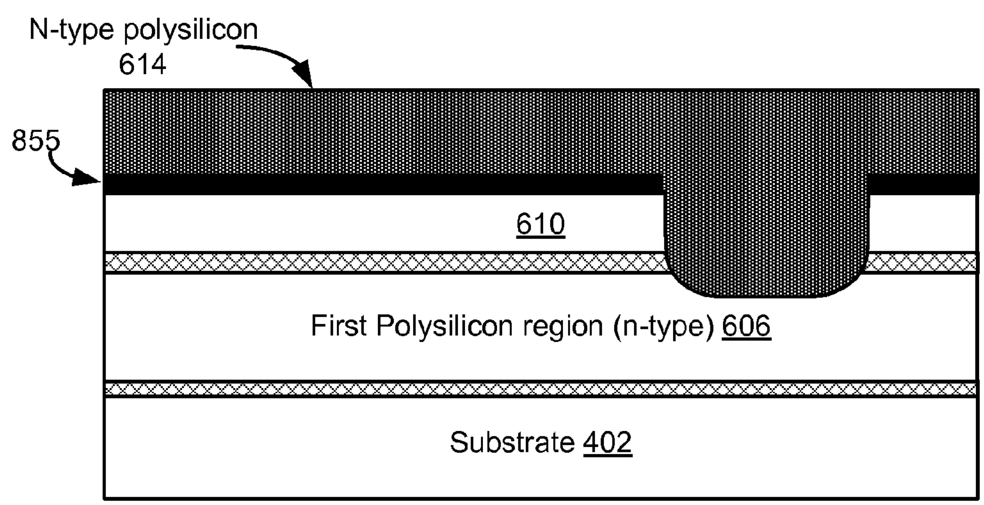

FIG. 8B is a flowchart describing a process 800 of fabricating a memory cell with a conductive barrier layer 850 between a MC lower CG 426 (p-type region) and a MC upper CG 428 (n-type region). FIGS. 8C-8E depict results after various steps in process 800. The process begins after step 508 of FIG. 5. Recall that step 508 is forming a p-type region of polysilicon to be used for the lower portions of memory cell control gates.

In step 809, a conductive barrier layer is formed over the p-type region of polysilicon. For example, titanium nitride, tantalum nitride, tungsten nitride, or a silicide as formed over the polysilicon. Numerous techniques may be used to form the barrier layer, including, but not limited to, atomic layer deposition, chemical vapor deposition. FIG. 8C depicts results after step 809. FIG. 8C shows a conductive barrier layer 855 over the p-type region of polysilicon 610.

In step 810, a control gate/IPD cutout 612 is made in regions in which select gates will be formed. This step is similar to step 510 of the process of FIG. 5. FIG. 8D depicts results after step 810.

In step 812, a region of polysilicon is formed to be used for MC upper CG 428. Step 812 is similar to step 512 of the process 500 of FIG. 5. This polysilicon may be deposited over remaining portions of the barrier layer 855. Note that the cutout region 612 may be filled in step 812. In some embodiments, this region of polysilicon is n-type. In some embodiments, the polysilicon is doped in-situ. In some embodiments, the polysilicon is deposited un-doped. Later one or more impurities are added. FIG. 8E depicts results after step 812, in which the n-type polysilicon 614 is shown over the conductive barrier layer 855.

After step 812, processing may be similar as described in steps 514-522 of the process of FIG. 5 in order to form the floating gate and transistor stacks. The result may be similar to the device depicted in FIG. 8A, which shows the barrier layer 850 between a MC lower CG 426 (p-type region) and a MC upper CG 428 (n-type region).

Note that the process 700 already discussed for forming the barrier layer 450 for the control gate of the transistor may be used to form a barrier layer 850 in the control gates of the memory cells (see, for example, FIG. 7D). However, instead of forming the upper portion of the control gates of memory cells with p-type polysilicon, they may be formed with n-type polysilicon. Therefore, with appropriate modification, process 700 may be used instead of process 800 to form a barrier layer 850 between a MC lower CG 426 (p-type region) and a MC upper CG 428 (n-type region).

Figure 9:
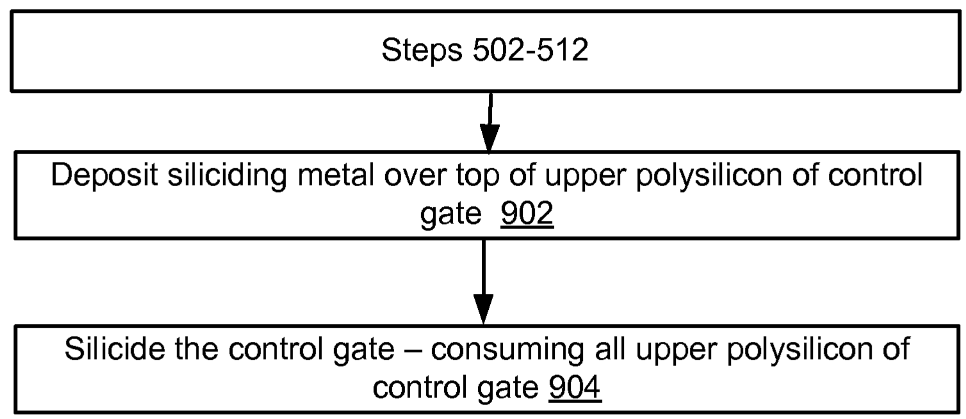
FIG. 9 depicts a process of siliciding the control gate.

Another technique to alleviate a possible p-n junction in the control gates of memory cells is to allow a silicide to consume all of the upper control gate portion of memory cells. In some embodiments, the control gate is silicided. During control gate silicidation, if the silicide is allowed to consume all of the upper control gate portion, then the p-n junction may be avoided. FIG. 9 depicts a process of siliciding the control gate of memory cells. Prior to this process, materials for the lower and upper polysilicon portions of the control gates of memory cells have been formed. For example, process 500 has been performed up to step 512 to form a structure such as depicted in FIG. 6C. In step 902, a siliciding metal is formed on top of the control gates of memory cells. For example, referring to FIG. 6C, a siliciding metal may be formed over the n-type polysilicon 614.

In step 904, the control gate of memory cells is silicided. In one embodiment, a thermal anneal is performed to cause the silicide forming metal to react with the polysilicon control gate to form a silicide. The thermal anneal may be performed for a sufficient length of time and a sufficient temperature such that the silicide consumes the entire second polysilicon region of the control gate (at least in the memory cell area). A small portion of the lower polysilicon region 610 of the control gate may be consumed by the silicide as well. Therefore, the silicide extends over the p-n junction in the control gate. Note that the thermal anneal is not required to be performed prior to moving on to other process steps. For example, the thermal anneal could happen after or during steps 514-522 of process 500.

Still another technique to alleviate a possible problems associated with a p-n junction in a control gate of a memory cell is to highly dope one or both of the MC upper CG 428 and MC lower CG 426. If the doping concentration is sufficiently high, the p-n junction may breakdown during high field stress. Therefore, rectification problems associated with the p-n junction may be alleviated.

Figure 10:
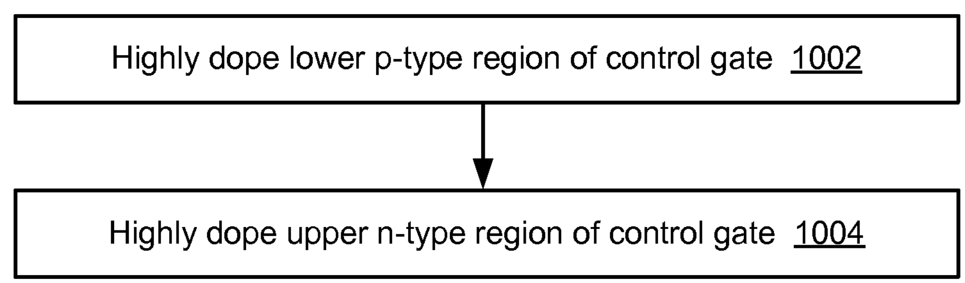
FIG. 10 is a flowchart of one embodiment of a process of forming a control gate that is highly doped.

FIG. 10 is a flowchart of one embodiment of a process of forming a control gate. In this embodiment, the control gate is heavily doped to alleviate possible rectification problems associated with a p-n junction. In step 1002, the MC lower CG 426 is heavily doped. In one embodiment, this is performed in situ. In one embodiment, a dopant is implanted. Both in situ and implantation may be used. In one embodiment, the MC lower CG 426 includes p-type polysilicon. Step 1002 is one embodiment of forming a MC lower CG 426 of step 306 of FIG. 3.

In step 1004, the MC upper CG 428 is heavily doped. In one embodiment, this is performed in situ. In one embodiment, a dopant is implanted. Both in situ and implantation may be used. Step 1004 is one embodiment of forming the MC upper CG 428 of step 308 of FIG. 3. In one embodiment, the MC upper CG 428 includes n-type polysilicon. The doping concentrations of the lower and upper portions may be selected such that rectification problems associated with the p-n junction between the n- and p-regions may be reduced to an acceptable level or eliminated completely.

In one embodiment, the MC upper CG 428 is formed with a metal, a metal nitride, or a silicide instead of with polysilicon. The transistor upper CG 448 may also be formed from the metal. FIG. 4F depicts a diagram of one embodiment of memory cells having a control gate with a MC lower CG that is p-type and a MC upper CG 428 that is metal (or metal nitride or silicide). These embodiments do not have a p-n junction in the control gate of either the memory cells or transistors. Therefore, possible problems associated with a p-n junction are avoided.

Figure 11:
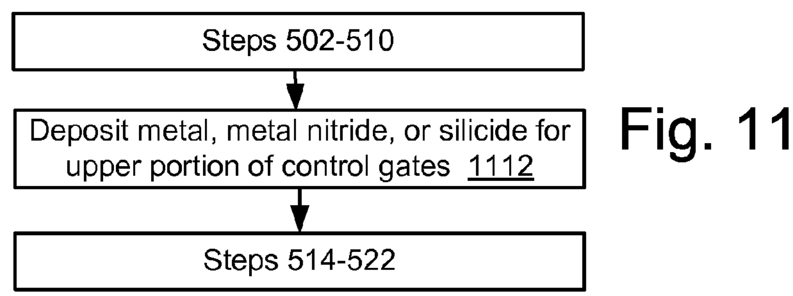
FIG. 11 depicts a flowchart of one embodiment of a process flow for forming memory cells with metal or metal nitride upper portions of control gates.

FIG. 11 depicts a flowchart of one embodiment of a process flow for forming memory cells with metal or metal nitride upper portions of control gates. Steps 502-510 may be performed prior to the process to arrive at a structure similar to FIG. 6B. Next, a metal, metal nitride, or silicide region is formed over the lower polysilicon 610 of the control gates, in step 1112. Example metals include, but are not limited to, tungsten, titanium, and tantalum. Example metal nitrides include, but are not limited to, tungsten nitride, titanium nitride, and tantalum nitride. Example silicides include, but are not limited to cobalt silicide, tungsten silicide, and titanium silicide.

Next steps 514-522 of FIG. 5 may be formed to form floating gate and transistor stacks. In this case however, etching of the metal or metal nitride may be performed when forming the floating gate stacks (instead of etching the third region of polysilicon). After source/drain regions are formed, a structure such as the one depicted in FIG. 4F may result.

Figure 12A:
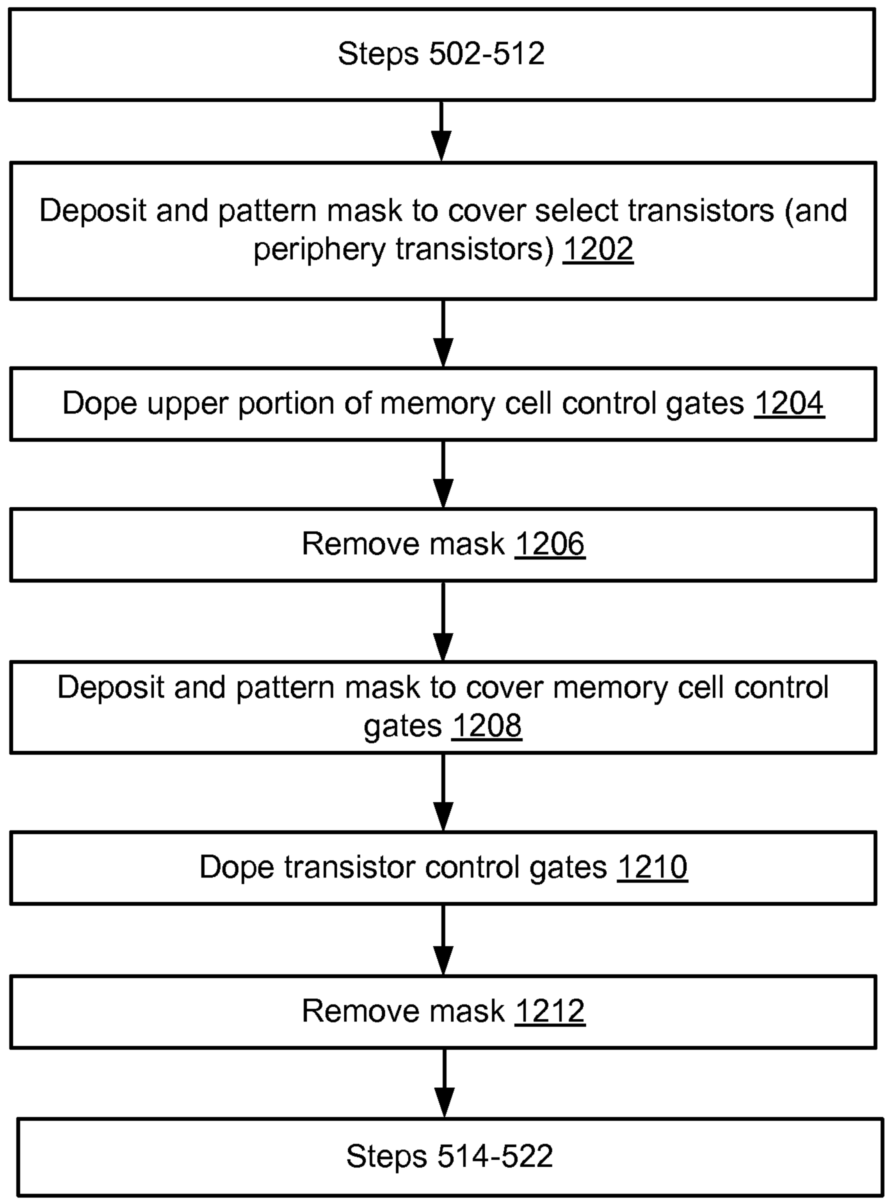
FIG. 12A is a diagram of one embodiment of a process of doping control gates and select gate transistors.

In one embodiment, the control gates for the memory cells are doped separately from the upper portion 448 of the select gate transistor (and other transistors). FIG. 12A is a diagram of one embodiment of a process of doping control gates and select gate and other transistors. Prior to the process of FIG. 12, steps 502-512 may be performed to form a structure with the polysilicon that will be used to form the MC upper CG 428 in place. Results are depicted in FIG. 12B. However, in this embodiment, the polysilicon for the upper portion of the control gate is not yet doped. Thus, there may be an undoped polysilicon region 1274 over the p-type semiconductor region 610.

In step 1202, a mask is deposited and patterned to cover the select gate transistors. For example, the mask covers regions in which the select gate transistors will be formed. However, the regions where the control gates of memory cells are to be formed are not covered. The mask may also cover regions where other devices are to be formed, such as transistors in the peripheral region to the memory array.

In step 1204, with the mask in place, doping of the upper portion of the control gates is performed. Specifically, the doping may be of a layer of material that will be used to form the MC upper CG 428. In some embodiments, the doping is p-type. Therefore, there will not be a p-n junction in the control gate. As one example, boron in implanted. FIG. 12C depicts a mask 1275 over the transistor region, with doping being performed in the region in which MC upper CG 428 are to be formed. Specifically, region 1274 is being doped.

In step 1206, the mask 1275 that covers the transistors (or regions in which they will be formed) is removed. In step 1208, another mask is deposited and patterned to cover the control gates of the memory cells (or regions where they will be formed). However, the select gate transistors are not covered. This mask may leave uncovered regions where other devices will be formed, such as transistors in the peripheral region to the memory array.

In step 1210, the gates of the select gate and other transistors are doped. Specifically, the doping may be of a layer of material that will be used to form the transistor upper CG 448. In this case, the doping may be n-type. Therefore, the entire control gate of the select gate transistor may be n-type polysilicon. Note that other transistors, such as those in the periphery may also be doped in step 1210. FIG. 12D depicts a mask 1278 over the memory cell region, with doping being performed in the region in which transistor upper CG 448 is to be formed. Specifically, region 1274 is being doped with mask 1278 in place.

In step 1212, the mask 1278 that was formed in step 1208 is removed. Next, steps 514-522 of FIG. 5 may be performed to complete formation of the floating gate stacks and transistor stacks. Note that the order in which transistors and control gates of memory cells are doped could be reversed. For example, steps 1208-1212 could be performed prior to step 1202-1206.

Figure 13A:
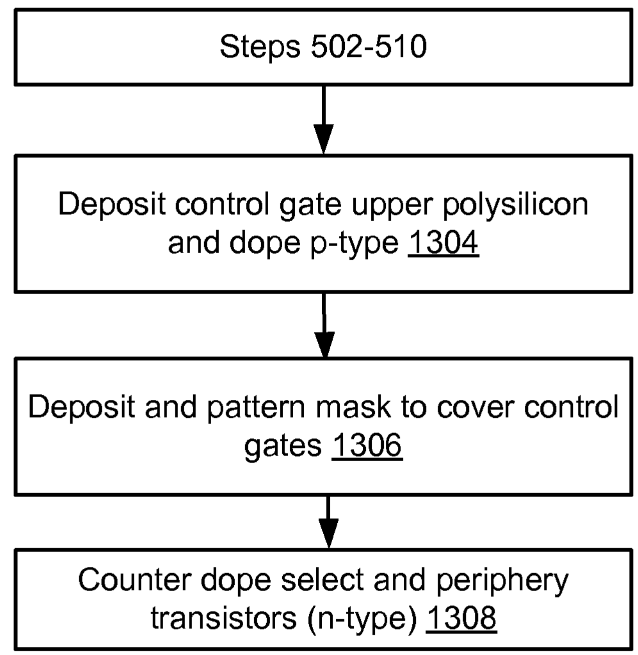
FIG. 13A is a flowchart of one embodiment of a process of forming memory cells and transistors using counter-doping.

In some embodiments, counter-doping of the control gates of transistors is performed. This may alleviate concerns of forming both a n-type and p-type region in the transistor control gates (at least initially). Referring to FIGS. 6A-6C, in one embodiment, when forming layers 610 and 614, both layers 610, 614 may be doped in in-situ. However, then counter-doping may be performed in select gate transistor areas (and possibly periphery transistors). FIG. 13A is a flowchart of one embodiment of a process of forming memory cells and transistors. First steps 502-510 are performed to arrive at a structure such as shown in FIG. 6B. Note that the p-type semiconductor region 610 may be deposited with in situ doping or doping may be by implant.

Figure 13B:
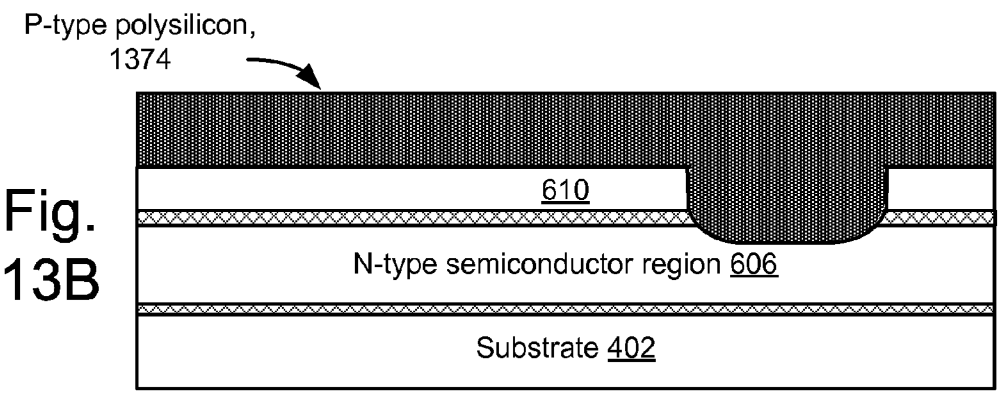
FIGS. 13B and 13C depict results after various steps of the process of FIG. 13A.

In step 1304, the p-type polysilicon 714 is deposited and doped p-type. Doping may be in situ, but is not required. This doping may also affect the transistor regions. FIG. 13B depicts p-type polysilicon 1374 formed in the cutout trenches and over the p-type semiconductor region 610.

Figure 13C:
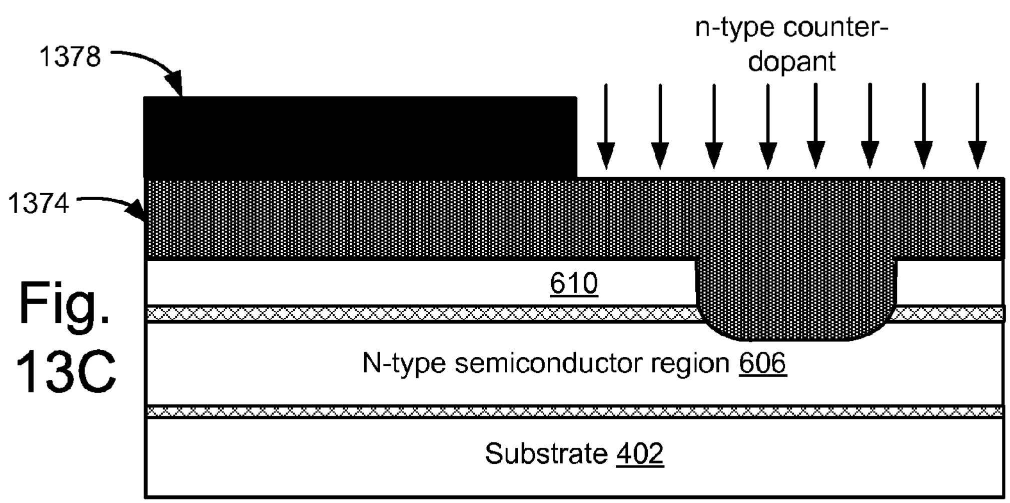

In step 1306, a mask is deposited and patterned to cover the region in which the control gates of memory cells are to be formed. In step 1308, counter doping is performed for the select gate transistors and peripheral transistors. Referring to FIG. 13C, an n-type impurity is implanted in areas for select gate transistors (and possibly peripheral transistors) with mask 1378 in place over memory cell regions. The n-type impurity may counter-dope the p-type impurity of step 1304. The net result is that the control gates of memory cells have a MC lower CG 426 p-type region and a MC upper CG 428 p-type region (as in FIG. 7D). However, the transistor upper CG 448 may be doped more like an n-type region due to the counter-doping. Therefore, there is not a p-n junction in the transistor control gate.

Figure 14A:
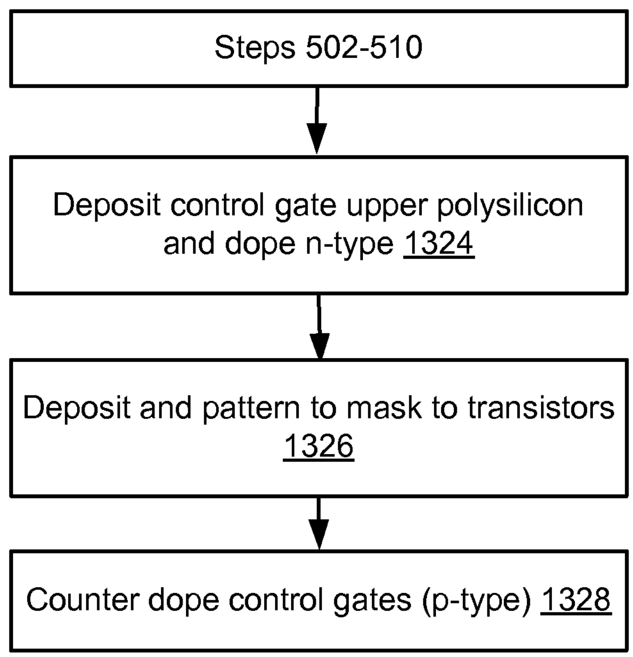
FIG. 14A is a flowchart of one embodiment of a process of forming memory cells and transistors using counter-doping.

Rather than counter-doping the transistors, the control gates of memory cells may be counter-doped. FIG. 14A is a flowchart of one embodiment of a process of forming memory cells and transistors. First steps 502-510 may be performed to arrive at structure of FIG. 6B. Note that the p-type semiconductor region 610 may be deposited with in situ doping or doping may be by implant.

Figure 14B:
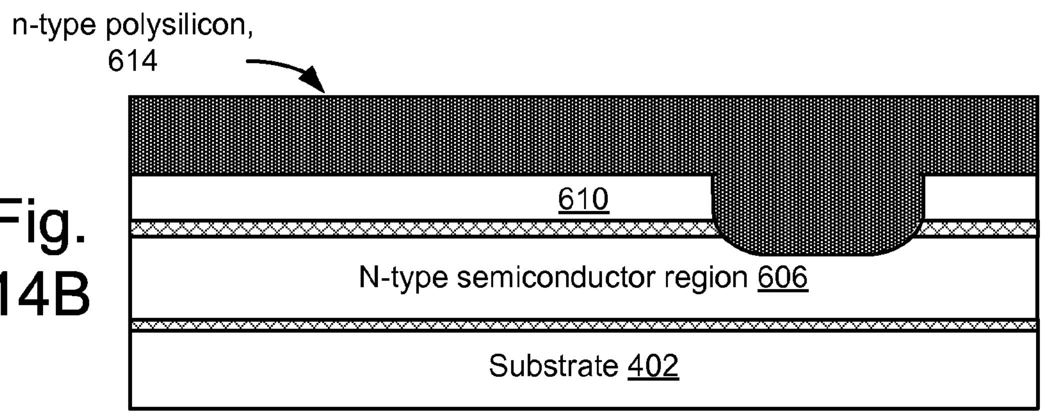
FIGS. 14B and 14C depict results after various steps of the process of FIG. 14A.

In step 1328, an n-type semiconductor region 614 is deposited and doped with an n-type impurity. This doping may also affect the transistor regions. For example, referring to FIG. 14B, the n-type semiconductor region 614 may be formed in the cutout trenches.

Figure 14C:
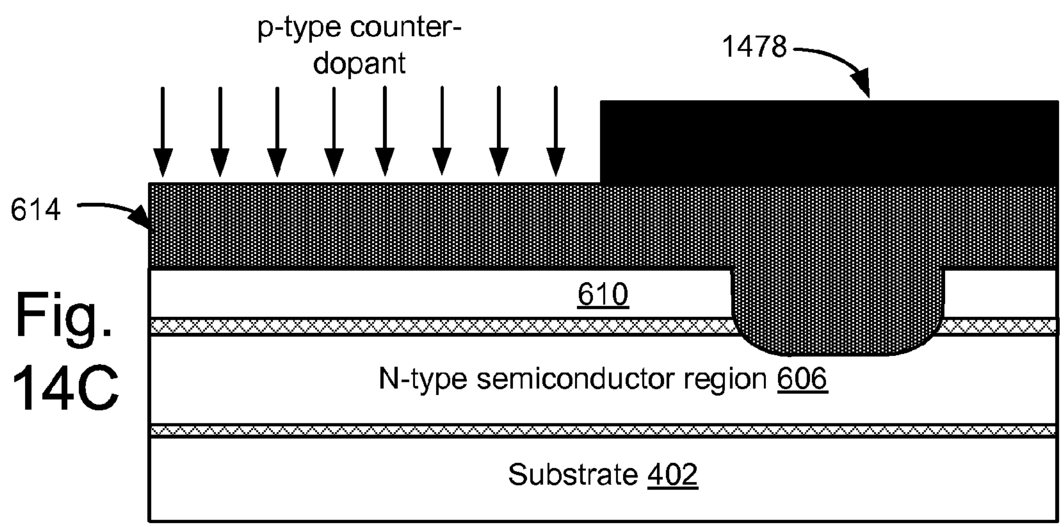

In step 1326, a mask is deposited and patterned to cover the transistors. In step 1328, counter doping is performed for the control gates of memory cells. Referring to FIG. 14C, a p-type impurity is implanted in areas in which the control gates of memory cells will be formed with a mask 1478 in place over regions where transistors will be formed. The p-type impurity may counter-dope the n-type impurity of step 1324. The net result is that the control gate memory cells have a MC lower CG 426 that is p-doped and a MC upper CG 428 that is effectively p-doped due to the counter-doping. Therefore, there is not a p-n junction in the memory cell control gates. The transistor control gates will have a transistor lower CG 442 that is n-type and a transistor upper CG 448 that is also n-type due to the original doping.

Herein, numerous examples of polysilicon control gates have been presented. However, it will be understood that other semiconductors might be used. In the above examples, the substrate is made of silicon. However, other materials known in the art can also be used such as Gallium Arsenide, etc.

One embodiment includes a method of forming a memory array. The method comprises forming floating gates of non-volatile storage elements and lower portions of control gates of transistors from an n-type semiconductor; forming lower portions of control gates of the non-volatile storage elements from a p-type semiconductor; and forming upper portions of the control gates of the non-volatile storage elements and upper portions of the control gates of the transistors, including depositing material for both the upper portions of the control gates of the non-volatile storage elements and upper portions of the control gates of the transistors in the same process step.

One embodiment includes a method of forming a memory array, the method comprises forming a first region of polysilicon to be used for floating gates of non-volatile storage elements and lower portions of control gates of transistors, the first region of polysilicon is n-type polysilicon; forming an inter-poly dielectric over the first region of polysilicon; forming a second region of polysilicon over the inter-poly dielectric, the second region of polysilicon is formed in regions in which the non-volatile storage elements and the transistors are to be formed, the second region of polysilicon is p-type polysilicon; removing portions of the second region of polysilicon in the regions in which the transistors are to be formed to expose the first region of polysilicon; depositing a third of polysilicon over the second region of polysilicon while depositing the third region of polysilicon over the exposed first region of polysilicon; etching the first region of polysilicon, the inter-poly dielectric, the second region of polysilicon, and the third region of polysilicon to form control gates for the non-volatile storage elements from the second region of polysilicon and the third region of polysilicon and to form control gates for the transistors from the first region of polysilicon and the third region of polysilicon.

One embodiment includes a method of forming a memory array. The method comprises forming a region of n-type polysilicon to be used for floating gates of non-volatile storage elements and lower portions of control gates of transistors; forming an inter-poly dielectric over the region of n-type polysilicon; forming p-type polysilicon over the inter-poly dielectric, the p-type polysilicon is formed in regions in which the non-volatile storage elements and the control gates of the transistors are to be formed; removing portions of the p-type polysilicon in the regions in which the control gates of the transistors are to be formed to expose the region of n-type polysilicon; depositing a metal over the p-type polysilicon while depositing the metal over the exposed region of n-type polysilicon; and etching the region of n-type polysilicon, the inter-poly dielectric, the p-type polysilicon, and the metal to form control gates for the non-volatile storage elements from the p-type polysilicon and the metal and to form control gates for the transistors from the region of n-type polysilicon and the metal.

One embodiment includes a non-volatile storage system, comprising non-volatile storage elements and transistors. An individual non-volatile storage element includes: a floating gate formed from an n-type semiconductor; inter-poly dielectric; and a control gate that includes a lower portion formed from a p-type semiconductor and an upper portion formed from the n-type semiconductor, the inter-poly dielectric resides between the floating gate and the control gate. An individual transistor includes a control gate that includes a continuous region of the n-type semiconductor in a region that coincides with the floating gates, the inter-poly dielectric and the control gates of the non-volatile storage elements.

One embodiment includes a non-volatile storage system, comprising non-volatile storage elements and transistors. An individual non-volatile storage element includes: a floating gate formed from an n-type semiconductor; inter-poly dielectric; and a control gate formed from a p-type semiconductor. An individual transistor includes a control gate that includes a lower portion of the n-type semiconductor and an upper portion of the p-type semiconductor; and a conductive barrier layer between the lower portion and the upper portion One embodiment includes a non-volatile storage system, comprising non-volatile storage elements and transistors. An individual non-volatile storage element includes: a floating gate formed from an n-type semiconductor; an inter-gate dielectric; and a control gate that includes a lower portion formed from a p-type semiconductor and an upper portion formed from metal. An individual transistor includes a control gate that includes a lower portion formed from the n-type semiconductor and an upper portion formed from the metal.

The foregoing detailed description of embodiments has been presented for purposes of illustration and description. It is not intended to be exhaustive or to limit embodiments to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of forming a memory array, the method comprising:

forming floating gates of non-volatile storage elements and lower portions of control gates of transistors from an n-type semiconductor;

forming lower portions of control gates of the non-volatile storage elements from a p-type semiconductor; and forming upper portions of the control gates of the non-volatile storage elements and upper portions of the control gates of the transistors, including depositing n-type semiconductor for both the upper portions of the control gates of the non-volatile storage elements and upper portions of the control gates of the transistors in the same process step.

2. The method of claim 1, wherein the forming control gates of the non-volatile storage elements and the forming control gates of the transistors include:

depositing the p-type semiconductor in regions where the non-volatile storage elements and regions where the transistors are to be formed; and etching the p-type semiconductor in the regions where the transistors are to be formed to expose the n-type semiconductor of the lower portions of the control gates of the transistors.

3. The method of claim 1, further comprising:

forming a conductive barrier layer between the lower portions and the upper portions of the control gates of the non-volatile storage elements.

4. The method of claim 1, wherein the forming lower portions of the control gates of the non-volatile storage elements and the forming upper portions of the control gates of the non-volatile storage elements include:

highly doping the upper portions and lower portions of the control gates of the non-volatile storage elements such that p-n junctions between the upper portions and the lower portions of the control gates of the non-volatile storage elements will break down during programming.

5. The method of claim 1, wherein the forming lower portions of the control gates of the non-volatile storage elements and the forming upper portions of the control gates of the non-volatile storage elements include:

forming a silicide of the entire upper portions of the control gates of the non-volatile storage elements.

6. The method of claim 1, wherein the forming control gates of the non-volatile storage elements and the forming control gates of the transistors includes:

depositing the p-type semiconductor in regions where the non-volatile storage elements and regions where the transistors are to be formed; and etching the p-type semiconductor in the regions where the transistors are to be formed to expose the n-type semiconductor for the lower portions of transistor control gates in regions where the transistors are to be formed.

7. The method of claim 1, wherein the n-type semiconductor for the floating gates of the non-volatile storage elements includes polysilicon.

8. The method of claim 7, wherein the n-type semiconductor for the upper portions of the control gates of the non-volatile storage elements and the upper portions of the control gates of transistors includes polysilicon.

9. A method of forming a memory array, the method comprising:

forming a first region of polysilicon to be used for floating gates of non-volatile storage elements and lower portions of control gates of transistors, the first region of polysilicon is n-type polysilicon;

forming an inter-poly dielectric over the first region of polysilicon;

forming a second region of polysilicon over the inter-poly dielectric, the second region of polysilicon is formed in regions in which the non-volatile storage elements and the transistors are to be formed, the second region of polysilicon is p-type polysilicon;

removing portions of the second region of polysilicon in the regions in which the transistors are to be formed to expose the first region of polysilicon;

depositing n-type polysilicon over the second region of polysilicon while depositing n-type polysilicon over the exposed first region of polysilicon; and etching the first region of polysilicon, the inter-poly dielectric, the second region of polysilicon, and the n-type polysilicon over the second region and the exposed first region to form control gates for the non-volatile storage elements from the second region of polysilicon and the n-type polysilicon over the second region and to form control gates for the transistors from the first region of polysilicon and the n-type polysilicon over the exposed first region.

10. The method of claim 9, further comprising:

forming a conductive barrier material between the second region of polysilicon and the n-type polysilicon over the second region at least in the control gates of the non-volatile storage elements.

11. The method of claim 9, further comprising:

highly doping the n-type polysilicon over the second region and the p-type polysilicon of the second region such that p-n junctions between upper portions and lower portions of the control gates of the non-volatile storage elements will break down during programming.

12. The method of claim 9, further comprising:

forming a silicide of the n-type polysilicon over the second region.

13. A method of forming a memory array, the method comprising:

forming floating gates of non-volatile storage elements and lower portions of control gates of transistors from an n-type semiconductor;

forming lower portions of control gates of the non-volatile storage elements from a p-type semiconductor; and forming upper portions of the control gates of the non-volatile storage elements and upper portions of the control gates of the transistors from p-type semiconductor, including depositing material for both the upper portions of the control gates of the non-volatile storage elements and upper portions of the control gates of the transistors in the same process step.

14. The method of claim 13, further comprising:

forming a conductive barrier layer between the n-type semiconductor and the p-type semiconductor in the control gates of the transistors.

15. The method of claim 13, wherein the depositing material for both the upper portions of the control gates of the non-volatile storage elements and the upper portions of the control gates of the transistors in the same process step includes depositing a p-type semiconductor for the upper portions of the control gates of the non-volatile storage elements and the upper portions of the control gates of the transistors in the same process step.

16. The method of claim 13, further comprising:

counter-doping the upper portions of the control gates of the transistors with an n-type dopant.

* * * * *